(12) United States Patent
Im et al.

(10) Patent No.: US 12,017,465 B2
(45) Date of Patent: Jun. 25, 2024

(54) INKJET PRINTING APPARATUS AND METHOD FOR ALIGNING DIPOLES

(71) Applicant: Samsung Display Co., LTD., Yongin-si (KR)

(72) Inventors: Hyun Deok Im, Seoul (KR); Jong Hyuk Kang, Suwon-si (KR); Hyun Min Cho, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 69 days.

(21) Appl. No.: 17/786,293

(22) PCT Filed: Dec. 15, 2020

(86) PCT No.: PCT/KR2020/018376
§ 371 (c)(1),
(2) Date: Jun. 16, 2022

(87) PCT Pub. No.: WO2021/125754
PCT Pub. Date: Jun. 24, 2021

(65) Prior Publication Data
US 2023/0025604 A1   Jan. 26, 2023

(30) Foreign Application Priority Data
Dec. 16, 2019  (KR) ................. 10-2019-0167753

(51) Int. Cl.
*B41J 2/095*   (2006.01)
*B41J 2/09*    (2006.01)
(Continued)

(52) U.S. Cl.
CPC .............. *B41J 25/006* (2013.01); *B41J 2/09* (2013.01); *B41J 2/095* (2013.01); *B41J 2/14072* (2013.01);
(Continued)

(58) Field of Classification Search
CPC ... B41J 25/006; B41J 2/09; B41J 2/095; B41J 2/14072; B41J 2/40; H01L 21/02; H01L 21/02288
See application file for complete search history.

(56) References Cited

U.S. PATENT DOCUMENTS 5,489,929 A      2/1996  Vago
5,975,680 A  *  11/1999  Wen ..................... B41J 2/01
                                                      347/43
(Continued)

FOREIGN PATENT DOCUMENTS

CN   1070610    4/1993
CN   1421316    6/2003
(Continued)

OTHER PUBLICATIONS

International Search Report, with English translation, corresponding to International Application No. PCT/KR2020/018376 dated Mar. 11, 2021.
(Continued)

*Primary Examiner* — Yaovi M Ameh
(74) *Attorney, Agent, or Firm* — KILE PARK REED & HOUTTEMAN PLLC

(57) ABSTRACT

An inkjet printing apparatus comprises a frame, an inkjet head disposed on the frame, a first probe disposed on the frame, arranged at a side of the inkjet head, and providing a first voltage, and a second probe disposed on the frame, arranged at another side of the inkjet head, and providing a second voltage.

20 Claims, 23 Drawing Sheets

(51) Int. Cl.
*B41J 2/14*      (2006.01)
*B41J 2/40*      (2006.01)
*B41J 25/00*     (2006.01)
*H01L 21/02*     (2006.01)

(52) U.S. Cl.
CPC ............ *B41J 2/40* (2013.01); *H01L 21/02* (2013.01); *H01L 21/02288* (2013.01)

(56) References Cited

U.S. PATENT DOCUMENTS

| | | |
|---|---|---|
| 7,490,922 B2 | 2/2009 | Lee |
| 7,992,518 B2 | 8/2011 | Wu et al. |
| 8,272,346 B2 | 9/2012 | Bettencourt et al. |
| 8,536,071 B2 | 9/2013 | Bettencourt et al. |
| 10,981,184 B2 | 4/2021 | Cho et al. |
| 11,254,130 B2 | 2/2022 | Sherman et al. |
| 2002/0075345 A1 | 6/2002 | Shimizu et al. |
| 2022/0212468 A1 | 7/2022 | Sherman et al. |

FOREIGN PATENT DOCUMENTS

| | | | | |
|---|---|---|---|---|
| CN | 1994739 | 7/2007 | | |
| CN | 101255552 | 9/2008 | | |
| CN | 202025711 | 11/2011 | | |
| CN | 202186127 | 4/2012 | | |
| CN | 106457825 | 2/2017 | | |
| CN | 107623083 | 1/2018 | | |
| CN | 108654869 | 10/2018 | | |
| JP | H06-278309 | 10/1994 | | |
| JP | 11-286113 | 10/1999 | | |
| JP | 2003191449 A | * 7/2003 | ............ | B41J 2/01 |
| JP | 2010-36548 | 2/2010 | | |
| KR | 10-0703159 | 4/2007 | | |
| KR | 10-2007-0080432 | 8/2007 | | |
| KR | 10-2015-0006798 | 1/2015 | | |
| KR | 10-1482951 | 1/2015 | | |
| KR | 10-2018-0055021 | 5/2018 | | |
| TW | 200917348 | 4/2009 | | |

OTHER PUBLICATIONS

Written Opinion, with English translation, corresponding to International Application No. PCT/KR2020/018376, dated Mar. 11, 2021.

\* cited by examiner

INKJET PRINTING APPARATUS AND METHOD FOR ALIGNING DIPOLES

CROSS-REFERENCE TO RELATED APPLICATION(S)

This application is a national entry of International Application No. PCT/KR2020/018376, filed on Dec. 15, 2020, which claims under 35 U.S.C. 119(a) and 365(b) priority from to and benefits of Korean Patent Application No. 10-2019-0167753, filed on Dec. 16, 2019 in the Korean Intellectual Property Office (KIPO), and all the benefits accruing therefrom under 35 U.S.C. 119, the entire contents of which in its entirety are herein incorporated by reference.

BACKGROUND

1. Technical Field

The disclosure relates to an inkjet printing apparatus and a dipole alignment method.

2. Description of Related Art

The importance of display devices has steadily increased with the development of multimedia technology. In response thereto, various types of display devices such as an organic light emitting display (OLED), a liquid crystal display (LCD) and the like have been used.

A display device is a device for displaying an image, and may include a display panel, such as an organic light emitting display panel or a liquid crystal display panel. The light emitting display panel may include light emitting elements, e.g., light emitting diodes (LED), and examples of the light emitting diode include an organic light emitting diode (OLED) using an organic material as a fluorescent material, and an inorganic light emitting diode using an inorganic material as a fluorescent material.

SUMMARY

Aspects of the disclosure provide an inkjet printing apparatus capable of forming a uniform electric field on a large-area substrate using rotatable probe units.

Aspects of the disclosure also provide a dipole alignment method with improved alignment accuracy.

It should be noted that aspects of the disclosure are not limited thereto and other aspects, which are not mentioned herein, will be apparent to those of ordinary skill in the art from the following description.

According to an embodiment of the disclosure, an inkjet printing apparatus may include a frame, an inkjet head disposed on the frame, a first probe disposed on the frame, disposed at a side of the inkjet head, and providing a first voltage, and a second probe disposed on the frame, disposed at another side of the inkjet head, and providing a second voltage.

The first voltage may have a first polarity, and the second voltage may have a second polarity opposite the first polarity.

The inkjet printing apparatus may further include an electric field generation device that generates the first voltage and the second voltage, wherein the frame may include a line providing the first voltage to the first probe and the second voltage to the second probe.

Each of the first probe and the second probe may have a rotatable roller shape.

The inkjet printing apparatus may further include a stage disposed under the inkjet head.

The inkjet printing apparatus may further include a stage moving part that moves the stage in a first direction.

Each of the first probe and the second probe may be rotatable, extending directions of a rotational shaft of the first probe and a rotational shaft of the second probe may be parallel to each other, and the extending directions of the rotational shaft of the first probe and the rotational shaft of the second probe may be in a second direction perpendicular to the first direction.

According to an embodiment of the disclosure, an inkjet printing apparatus may include a stage, and a print head part located above the stage. The print head part may include a frame, inkjet heads disposed on the frame, first probe parts disposed on the frame disposed at first sides of the inkjet heads, and providing a first voltage, and second probe parts disposed on the frame disposed at second sides of the inkjet heads, and providing a second voltage.

The first probe parts may include at least one first probe having a rotatable roller shape, and the second probe parts may include at least one second probe having a rotatable roller shape.

An extending direction of a rotational shaft of the first probe and an extending direction of a rotational shaft of the second probe may be parallel to each other in a first direction.

The inkjet printing apparatus may further include a stage moving part that moves the stage in a second direction, wherein the second direction and the first direction may be perpendicular to each other The first probe part may include at least one rotatable first probe driving part, and at least one first probe moving in a rotating direction of the first probe driving part.

The first probe may have a pin shape.

Each of the inkjet heads may include a nozzle that sprays an ink including dipoles.

According to an embodiment of the disclosure, a dipole alignment method may include generating an electric field on a target substrate on which electrode pads extending in a first direction may be formed, spraying an ink including dipoles onto a region where the electric field may be generated, and seating the dipoles on the target substrate.

The electric field may be generated by a rotatable probe in electrical contact with the electrode pad, and an extending direction of a rotational shaft of the probe may be parallel to a second direction perpendicular to the first direction.

The target substrate may include a first electrode and a second electrode, and the seating of the dipoles may include seating the dipoles on the first electrode and the second electrode.

The generating of the electric field and spraying the ink may include aligning orientation directions of the dipoles by the electric field.

The generating of the electric field on the target substrate and spraying the ink may be performed using an inkjet printing apparatus.

The inkjet printing apparatus may include a frame, an inkjet head disposed on the frame, a first probe disposed at a side of the inkjet head and providing a first voltage, and a second probe disposed on the frame, disposed at another side of the inkjet head, and providing a second voltage.

Details of other embodiments may be included in the detailed description and the accompanying drawings.

According to an embodiment, an inkjet printing apparatus can form an entirely uniform electric field while spraying an ink onto a target substrate using inkjet heads and rotatable probe units. Accordingly, even in case that the target substrate is a large-area substrate, since the electric field can be uniformly formed on the entire target substrate, alignment accuracy can be improved while aligning orientation directions of dipoles. Further, since the alignment accuracy of a light emitting element may be improved, display defects of a display device can be reduced.

Since the electric field may be generated on the target substrate and the ink may be sprayed, the dipoles can be sprayed onto the target substrate in an aligned state while having a specific orientation direction.

The effects according to the embodiments are not limited by the contents above, and additional effects are included in this disclosure.

DETAILED DESCRIPTION OF THE EMBODIMENTS

Figure 1:
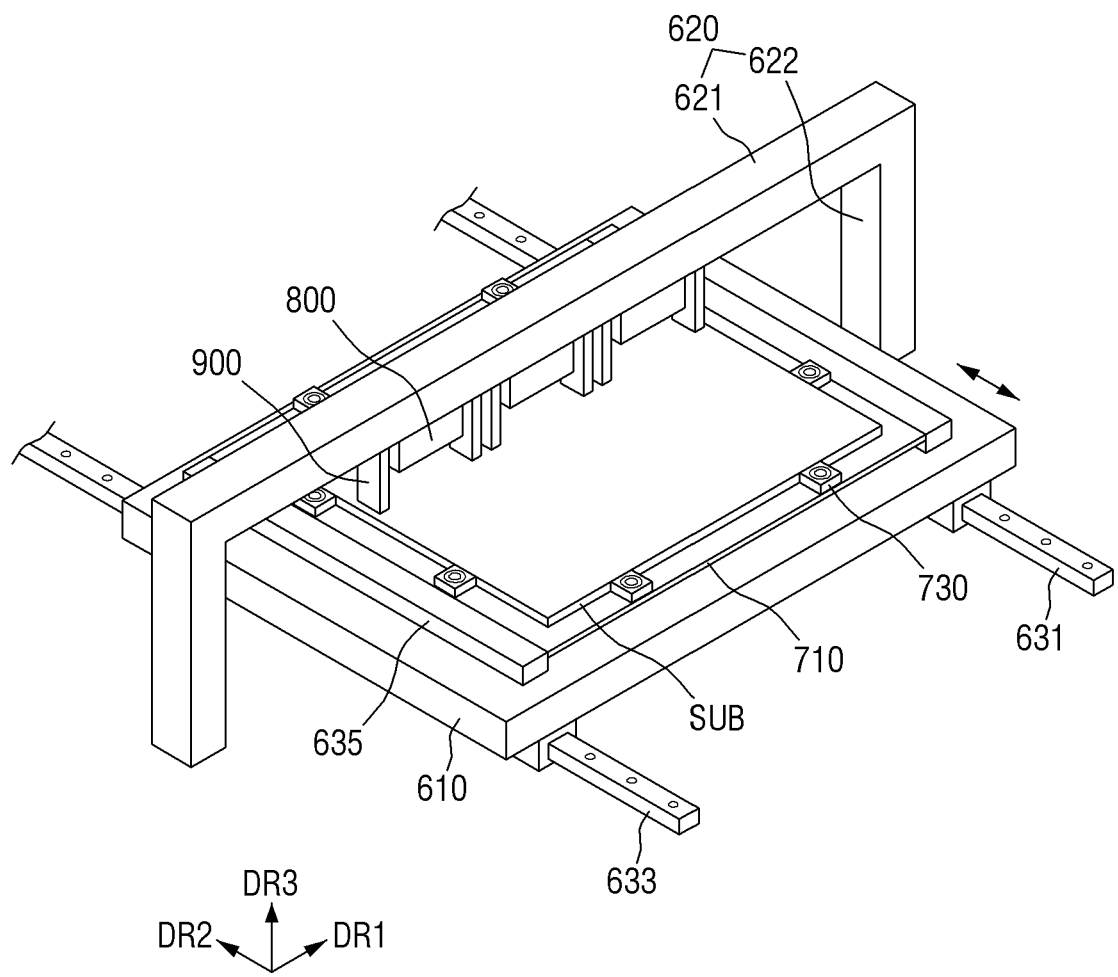
FIG. 1 is a schematic perspective view of an inkjet printing apparatus according to an embodiment.

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

The same reference numbers indicate the same components throughout the specification.

As used herein, the singular forms, "a," "an," and "the" are intended to include the plural forms as well, unless the context clearly indicates otherwise.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present.

When an element is referred to as being "in contact" or "contacted" or the like to another element, the element may be in "electrical contact" or in "physical contact" with another element; or in "indirect contact" or in "direct contact" with another element.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
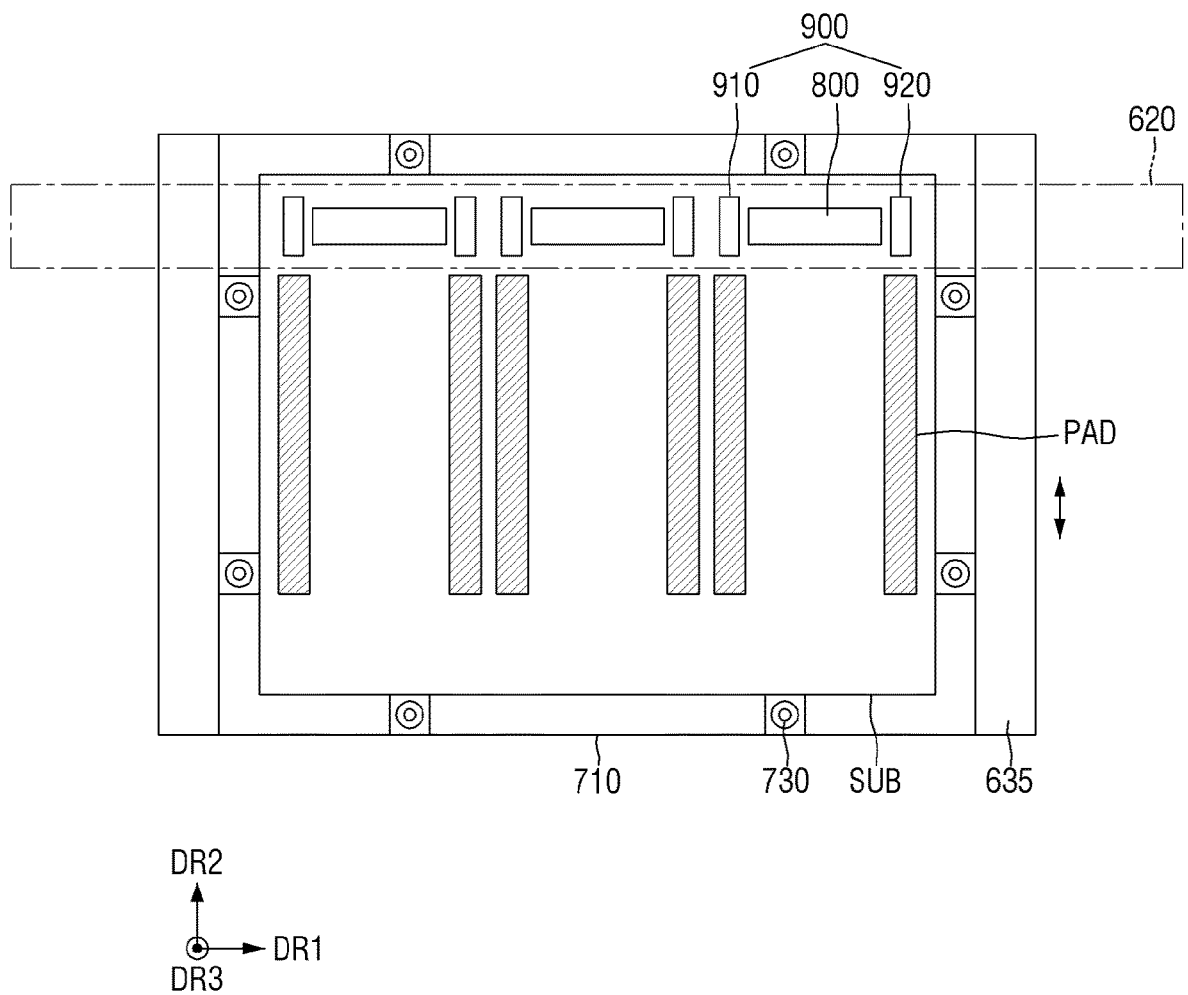
FIG. 2 is a partial schematic plan view of the inkjet printing apparatus according to an embodiment.
Figure 3:
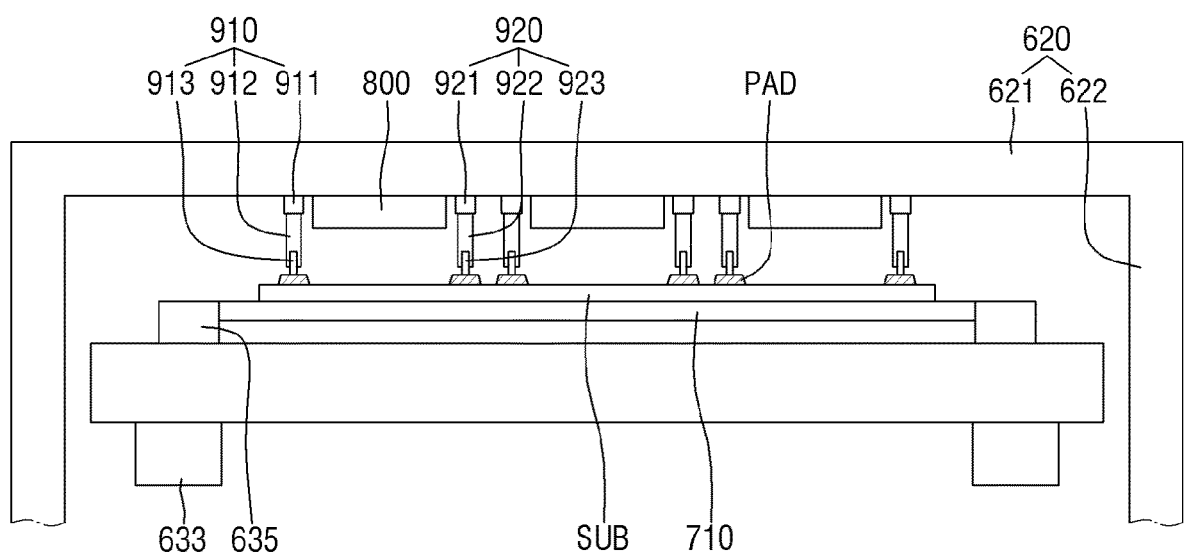
FIG. 3 is a partial schematic cross-sectional view of the inkjet printing apparatus according to an embodiment.
Figure 3:
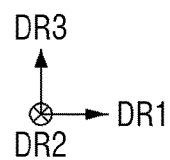

FIG. 1 is a schematic perspective view of an inkjet printing apparatus according to an embodiment. FIG. 2 is a partial schematic plan view of the inkjet printing apparatus according to an embodiment. FIG. 3 is a partial schematic cross-sectional view of the inkjet printing apparatus according to an embodiment.

A first direction DR1, a second direction DR2, and a third direction DR3 are defined in the drawings. The first direction DR1 and the second direction DR2 may be located on a plane and may be directions orthogonal to each other, and the third direction DR3 may be a direction perpendicular to each of the first direction DR1 and the second direction DR2.

Referring to FIGS. 1 to 3, an inkjet printing apparatus 1000 according to an embodiment may include a stage 710 and a print head unit (print head part) located above the stage 710. The print head unit may include a frame 620, inkjet heads 800 installed on the frame 620, and probe units 900 installed on the frame 620.

The inkjet heads 800 may be located above the stage 710 (in the third direction DR3) to be spaced apart from the stage 710, and the probe units 900 may be located above the stage 710 and may be disposed to be spaced apart from the inkjet heads 800. The inkjet printing apparatus 1000 may further include a base frame 610 and moving parts 631, 633, and 635 which may move the base frame 610 and/or the stage 710.

The inkjet printing apparatus 1000 according to an embodiment may form an electric field on a target substrate SUB and spray an ink (30, see FIG. 4) onto the target substrate SUB using the print head unit including the inkjet heads 800 and the probe units 900.

The base frame 610 may provide a region where the stage 710 may be disposed. The base frame 610 may move in the second direction DR2 by the base frame moving parts 631 and 633 which move the base frame 610. The base frame moving parts 631 and 633 respectively may include a first rail 631 and a second rail 633 extending in the second direction DR2, and the base frame 610 may be disposed on the first rail 631 and the second rail 633. The base frame 610 may move on the first rail 631 and the second rail 633 in the second direction DR2 through a separate moving member. The base frame 610 may move together with the stage 710 disposed on the base frame 610 in the second direction DR2. The base frame 610 and the stage 710 may pass through the inkjet heads 800 and the probe units 900 located thereon while reciprocating in the second direction DR2, the electric field may be formed on the base frame 610 and the stage 710, and the ink may be sprayed. Since the base frame 610 on which the stage 710 may be disposed reciprocates in the second direction DR2 by the base frame moving parts 631 and 633, a printing process may be performed on the entire area of the target substrate SUB.

The stage 710 may provide a space where the target substrate SUB may be disposed. The stage 710 may be disposed on the base frame 610. The target substrate SUB may be seated on the stage 710 to progress the printing process. The stage 710 may be made of quartz or a ceramic material, and may be provided in a form of an electrostatic chuck or the like, but the disclosure is not limited thereto.

An overall planar shape of the stage 710 may follow a planar shape of the target substrate SUB. For example, in case that the target substrate SUB has a rectangular shape, the overall shape of the stage 710 may be a rectangular shape, and in case that the target substrate SUB has a circular shape, the overall shape of the stage 710 may be a circular shape. In the drawings, the stage 710 of a rectangular shape in which long sides may be disposed in the first direction DR1 and short sides may be disposed in the second direction DR2 is illustrated.

Although not shown in the drawing, the stage 710 may further include an electric field generation member. The electric field generation member may be disposed on a back surface of the target substrate SUB, and may serve to generate an electric field thereon (in the third direction DR3), that is, in a space where the printing process may be performed. The electric field generation member may form an electric field on the target substrate SUB seated on the stage 710 by forming the electric field on the stage 710 while generating an electromagnetic wave in case that power is supplied to the electric field generation member and current flows, and the electric field may be transferred to the ink (30, see FIG. 4) sprayed into the space where the printing process may be performed. Dipoles (31, see FIG. 8) included in the ink (30, see FIG. 4) may each have a shape extending in a direction, and extending directions of the dipoles (31, see FIG. 8) may be aligned by the electric field to face a direction. The inkjet printing apparatus 1000 may form an electric field on the target substrate SUB by the probe units 900 to be described later and the electric field generation member, and orientation directions of the dipoles (31, see FIG. 8) included in the ink (30, see FIG. 4) may be controlled and aligned by the electric field. The electric field generation member may include electrodes or other various members capable of generating an electric field. The electric field generation member may be omitted.

Substrate aligners 730 may be installed on the stage 710 to align the target substrate SUB. The aligners 730 may be disposed on each side of the stage 710, and a region surrounded by the aligners 730 may be a region where the target substrate SUB may be disposed. The drawing illustrates that two aligners 730 are disposed on each side of the stage 710 to be spaced apart from each other, and a total of eight aligners 730 may be disposed on the stage 710, but the disclosure is not limited thereto, and the number, disposition, and the like of the aligners 730 may vary according to the shape or type of the target substrate SUB.

The stage moving part 635 may be installed on the base frame 610. The stage moving part 635, which moves the stage 710, may move the stage 710 in the second direction DR2. The stage moving part 635 may serve to supply the target substrate SUB to the inkjet printing apparatus 1000 or discharge the target substrate SUB for which the printing process has been completed. The stage 710 may be fixed to the base frame 610 by the stage moving part 635 during the printing process.

The print head unit may serve to print the ink (30, see FIG. 4) on the target substrate SUB. The inkjet printing apparatus 1000 may further include a providing unit of the ink 30 such as an ink cartridge, and the ink 30 supplied from the providing unit of the ink 30 may be sprayed (discharged) toward the target substrate SUB through the inkjet heads 800 of the print head unit. The ink 30 may be provided in a solution state. The ink 30 may include, for example, a solvent (32, see FIG. 8) and dipoles (31, see FIG. 8) included in the solvent 32. The solvent 32 may be acetone, water, alcohol, toluene, or the like, or a combination thereof. The solvent 32 may be a material vaporized or volatilized by room temperature or heat. The dipoles 31 may be dispersed in the solvent 32. The dipoles 31 may be solid materials finally remaining on the target substrate SUB after the solvent 32 may be removed.

Each of the dipoles 31 may be an object of which an end portion has a first polarity and another end portion has a second polarity different from the first polarity. For example, an end portion of the dipole 31 may have a positive polarity, and another end portion of the dipole 31 may have a negative polarity. In case that the dipole 31 having different polarities at end portions is placed in the electric field generated by probe units 900 to be described later, the orientation directions may be controlled by receiving electric forces (attraction and repulsion).

The dipole 31 may have a shape extending in a direction. The dipole 31 may have a shape such as a nanorod, a nanowire, a nanotube, or the like. As the dipole 31 included in the ink 30 according to an embodiment, a semiconductor nanorod of which an end portion may be doped with a first conductivity type (for example, p-type) impurity, and another end portion may be doped with a second conductivity type (for example, n-type) impurity may be applied.

The print head unit may be located above the stage 710. The print head unit may include the frame 620, and the inkjet heads 800 and the probe units 900 mounted on the frame 620.

The frame 620 may include a horizontal frame 621 extending in a horizontal direction and a vertical frame 622 connected to the horizontal frame 621 and extending in the third direction DR3 which may be a vertical direction. The extending direction of the horizontal frame 621 may be the same as the first direction DR1, which may be a long side direction of the stage 710. The vertical frame 622 may be disposed to be adjacent to the outside of the base frame 610. However, the disclosure is not limited thereto, and an end portion of the vertical frame 622 may be disposed on the base frame 610. The inkjet heads 800 and the probe units 900 may be mounted on the horizontal frame 621 of the frame 620.

The inkjet heads 800 may be disposed above the stage 710. The inkjet heads 800 may be mounted (installed) on the horizontal frame 621. Each inkjet head 800 may spray the ink (30, see FIG. 4) provided from an ink reservoir onto the target substrate SUB. The inkjet head 800 may be spaced apart from the stage 710 passing through the frame 620 by an interval at a lower portion of the horizontal frame 621. The separation interval between the inkjet head 800 and the stage 710 in the third direction DR3 may be adjusted by a height of the vertical frame 622. A separation distance between the inkjet head 800 and the stage 710 may be adjusted within a range in which the inkjet head 800 has an interval from the target substrate SUB and thus a process space may be secured in case that the target substrate SUB is disposed on the stage 710.

The inkjet heads 800 may be disposed to be spaced apart from each other in a direction. In an embodiment, the inkjet heads 800 may be arranged to be spaced apart from each other in the first direction DR1 parallel to the long side direction of the stage 710. The drawing illustrates that three inkjet heads 800 may be installed on the horizontal frame 621 to be spaced apart from each other in the first direction DR1, but since this is for schematically illustrating the inkjet head 800, the number of inkjet heads 800 is not limited thereto.

The probe unit 900 may include probe members (probe parts) 910 and 920. The probe members 910 and 920 may be disposed above the stage 710. The probe members 910 and 920 may be mounted (installed) on the horizontal frame 621. The probe unit 900 may further include an electric field application device (940, see FIG. 4). The probe unit 900 may transmit an electrical signal generated by the electric field generation device 940 to the target substrate SUB through the probe members 910 and 920. The electrical signal generated by the electric field generation device 940 may be transmitted to the target substrate SUB through the probe members 910 and 920 to generate an electric field (IEL, see FIG. 4) on the target substrate SUB. Detailed descriptions thereof will be described later.

Each of the probe members 910 and 920 may include one or more probes 913 and 923 and probe fixing parts 912 and 922 which respectively mount the probes 913 and 923 on the frame 620. The probe members 910 and 920 may further include probe circuit boards 911 and 921 which transmit an electrical signal generated by the electric field generation device 940 to the probes 913 and 923, respectively.

The probe fixing parts 912 and 922 may be mounted on the horizontal frame 621, and may be disposed on at least one side of each inkjet head 800. In an embodiment, in the drawings, a case in which two probes 913 and 923 and two probe fixing parts 912 and 922 are disposed to correspond to the inkjet heads 800 is illustrated.

Each of the probe members 910 and 920 may be disposed on at least one side of the inkjet head 800. In an embodiment, as shown in the drawings, the probe members 910 and 920 may include a first probe member 910 disposed at a side of the inkjet head 800 and a second probe member 920 disposed at another side of the inkjet head 800. For example, the probe member may include the first probe member 910 disposed at an outer side of a first short side of the inkjet head 800 and the second probe member 920 disposed to be adjacent to an outer side of a second short side of the inkjet head 800.

In the drawings, the first probe member 910 and the second probe member 920 may be respectively disposed at a side and another side of the inkjet head 800, but the disclosure is not limited thereto. For example, the first probe member 910 and the second probe member 920 may be disposed at a side of the inkjet head 800, and may also be disposed to be spaced apart from each other.

The first probe member 910 may include a first probe 913 which transmits the electrical signal transmitted from the above-described electric field generation device 940 onto the target substrate SUB. The first probe member 910 may further include a first probe fixing part 912 which fixes the first probe 913 to the frame 620, and a first circuit board 911 which transmits the electrical signal transmitted from the electric field generation device 940 to the first probe 913. The first circuit board 911 may be a printed circuit board or a flexible circuit board.

A structure of the second probe member 920 may be similar to that of the above-described first probe member 910. For example, the second probe member 920 may include a second probe 923 which transmits the electrical signal transmitted from the electric field generation device 940 onto the target substrate SUB. The second probe member 920 may further include a second probe fixing part 922 which fixes the second probe 923 to the frame 620, and a second circuit board 921 which transmits the electrical signal transmitted from the electric field generation device 940 to the second probe 923. The second circuit board 921 may be a printed circuit board or a flexible circuit board.

Detailed descriptions of the probe unit 900 will be described later.

Although one print head unit is exemplified in the drawing, the disclosure is not limited thereto. For example, in a case of a process of providing multiple inks 30 to the target substrate SUB, the same number of print head units as the types of the inks 30 may be further disposed.

Figure 4:
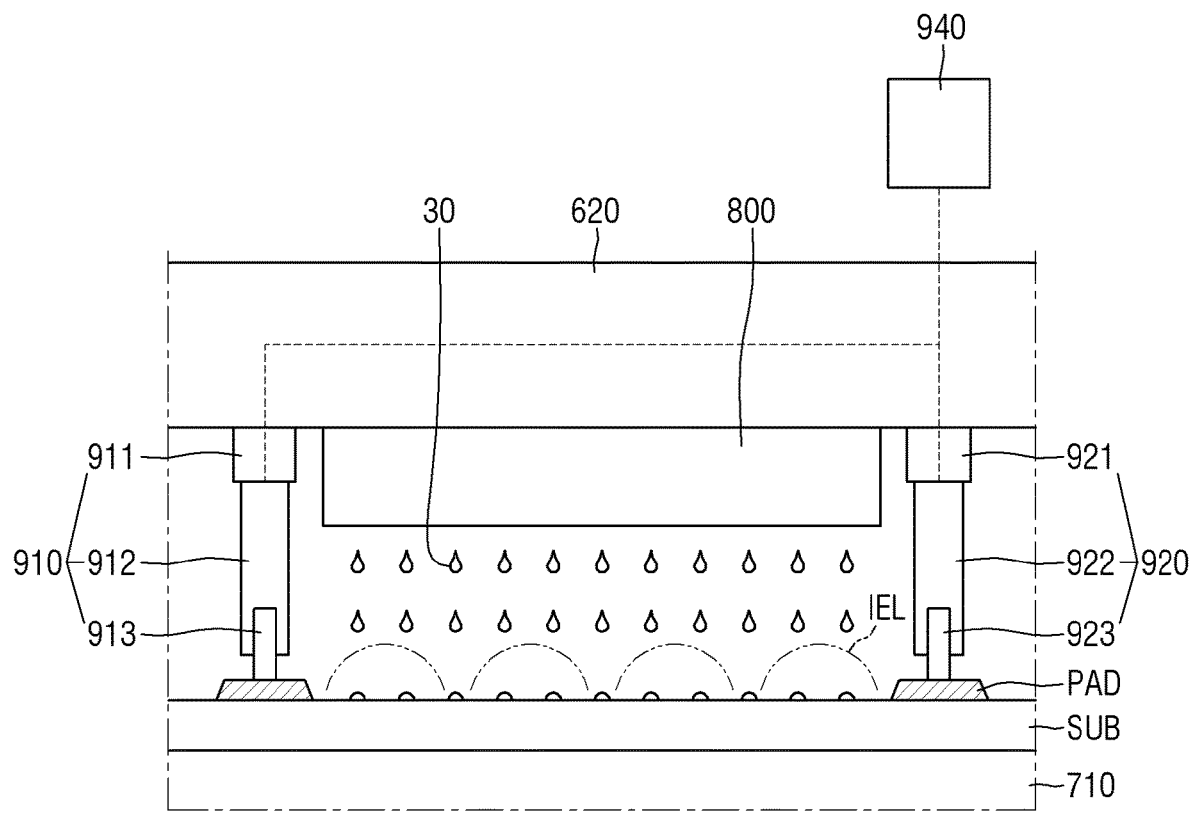
FIG. 4 is a partial schematic front view illustrating operations of an inkjet head and a probe unit in the inkjet printing apparatus according to an embodiment.
Figure 5:
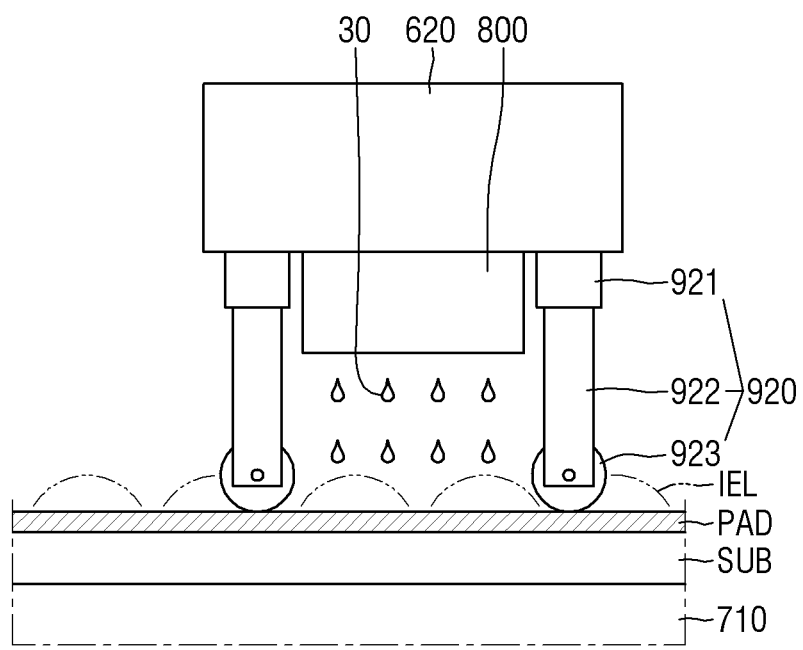
FIG. 5 is a partial schematic side view illustrating operations of the inkjet head and the probe unit in the inkjet printing apparatus according to an embodiment.
Figure 6:
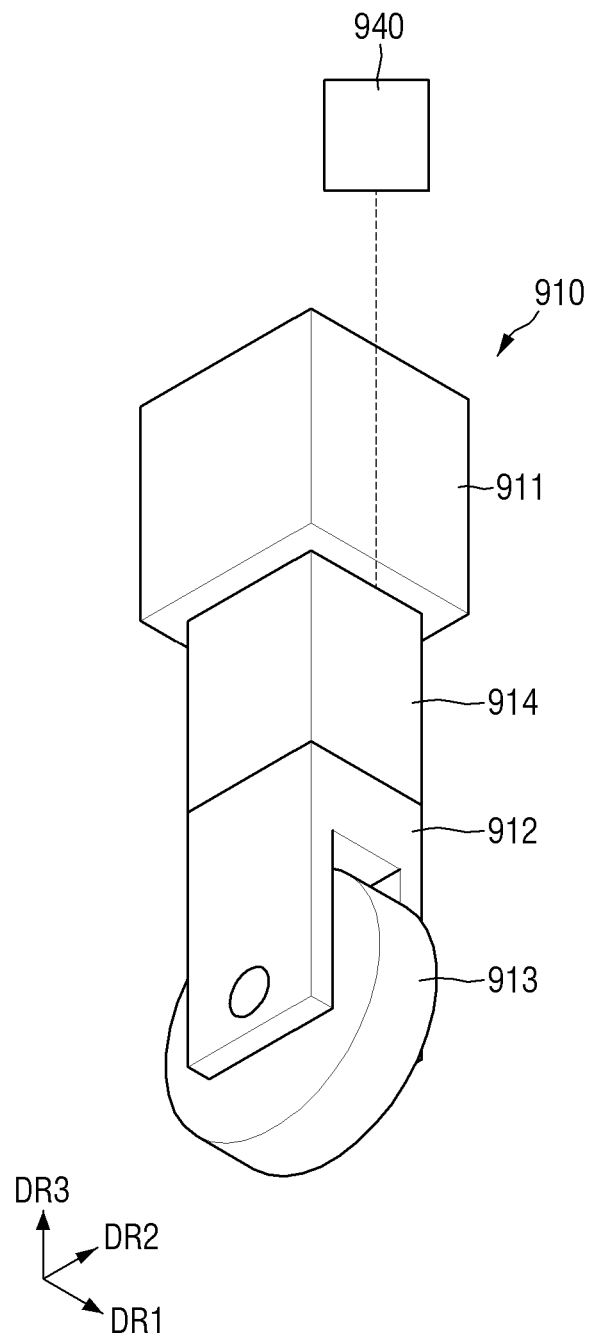
FIG. 6 is a schematic perspective view of a probe member according to an embodiment.
Figure 7:
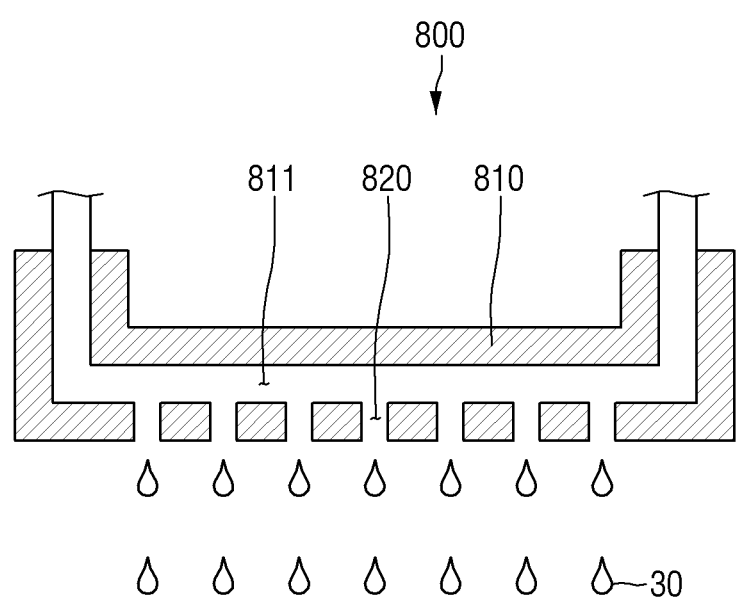
FIG. 7 is a schematic cross-sectional view of the inkjet head according to an embodiment.

FIG. 4 is a partial schematic front view illustrating operations of the inkjet head and the probe unit in the inkjet printing apparatus according to an embodiment. FIG. 5 is a partial schematic side view illustrating operations of the inkjet head and the probe unit in the inkjet printing apparatus according to an embodiment. FIG. 6 is a schematic perspective view of the probe member according to an embodiment. FIG. 7 is a schematic cross-sectional view of the inkjet head according to an embodiment. In FIGS. 4 and 5, for convenience of description, only one inkjet head 800 and the first probe member 910 and the second probe member 920 disposed to be adjacent to a side and another side of the inkjet head 800 are shown.

Referring to FIGS. 4 to 6, the probe members 910 and 920 may respectively include rotatable roller-shaped probes 913 and 923. Specifically, the first probe member 910 may include a first rotatable roller-shaped probe 913, and the second probe member 920 may include a second rotatable roller-shaped probe 923. The probes 913 and 923 each formed in the roller shape may be fixed to the probe fixing parts 912 and 922 to be rotated. The rotation may be performed using a separate probe driving part, or as will be described later, in case that the stage 710 reciprocates in the second direction DR2, the probes 913 and 923 may relatively rotate without a separate driving device.

The first probe 913 may rotate with a rotational shaft. An extending direction of the rotational shaft of the first probe 913 may be the first direction DR1 perpendicular to the second direction DR2 which may be a moving direction of the stage 710. Accordingly, in case that the stage 710 reciprocates in the second direction DR2 as the first probe 913 has the rotational shaft parallel to the first direction DR1 and may be formed in the rotatable roller shape, the first probe 913 may rotate.

Like the above, the second probe 923 may rotate with a rotational shaft. An extending direction of the rotational shaft of the second probe 923 may be the first direction DR1 perpendicular to the second direction DR2 which may be the moving direction of the stage 710. Accordingly, in case that the stage 710 reciprocates in the second direction DR2 as the second probe 923 has the rotational shaft parallel to the first direction DR1 and may be formed in the rotatable roller shape, the second probe 923 may rotate.

The first probe 913 and the second probe 923 may respectively come into contact with upper surfaces of electrode pads PAD formed to extend on the target substrate SUB in the second direction DR2 during the printing process. For example, in case that the stage 710 moves in the second direction DR2, the first probe 913 and the second probe 923 may come into contact with the electrode pads PAD formed on the target substrate SUB, and rotate with rotational shafts in directions parallel to the first direction DR1. Accordingly, the first probe 913 and the second probe 923 may continuously transmit the electrical signal generated by the electric field generation device 940 to the electrode pads PAD.

The electric field generation device 940 may generate a first voltage having a first polarity and a second voltage having a second polarity opposite the first polarity. The first voltage and the second voltage may be respectively provided to the first probe 913 and the second probe 923 through lines included in the frame. In case that the first probe 913 and the second probe 923 respectively provided with the first voltage and the second voltage come into contact with the electrode pads PAD formed on the target substrate SUB, the electric field IEL may be formed.

A buffer member 914 may be further disposed between each of the probe fixing parts 912 and 922 and the frame 620. The buffer member 914 may serve to prevent the target substrate SUB from being damaged in case that the probe members 910 and 920 move in a direction above the target substrate SUB while coming into contact with the upper surfaces of the electrode pads PAD formed on the target substrate SUB while the printing process may be performed.

Referring to FIG. 7 in conjunction with FIGS. 1 to 5, the print head unit may include the inkjet heads 800. Each inkjet head 800 may include a print head 810 and nozzles 820 located in a bottom surface of the print head 810. The print head 810 may have a shape extending in a direction. An extending direction of the print head 810 may be the same as the extending direction of the horizontal frame 621 of the frame 620. For example, the extending direction of the print head 810 may be the first direction DR1, which may be a long side direction of the stage 710. The print head 810 may include an inner tube 811 formed along the extending direction. The nozzles 820 may be arranged along the extending direction of the print head 810. The nozzles 820 may be arranged in one row or multiple rows. In an embodiment, the number of nozzles 820 included in an inkjet head 800 may be 128 to 1800, but the disclosure is not limited thereto.

Each nozzle 820 may be connected to the inner tube 811 of the print head 810. The ink 30 may be supplied to the inner tube 811 of the print head 810, and the supplied ink 30 may flow along the inner tube 811 and may be sprayed through each nozzle 820. The ink 30 sprayed through the nozzle 820 may be supplied to the upper surface of the target substrate SUB. An amount of the ink 30 sprayed through the nozzles 820 may be adjusted according to a voltage applied to each nozzle 820.

Figure 8:
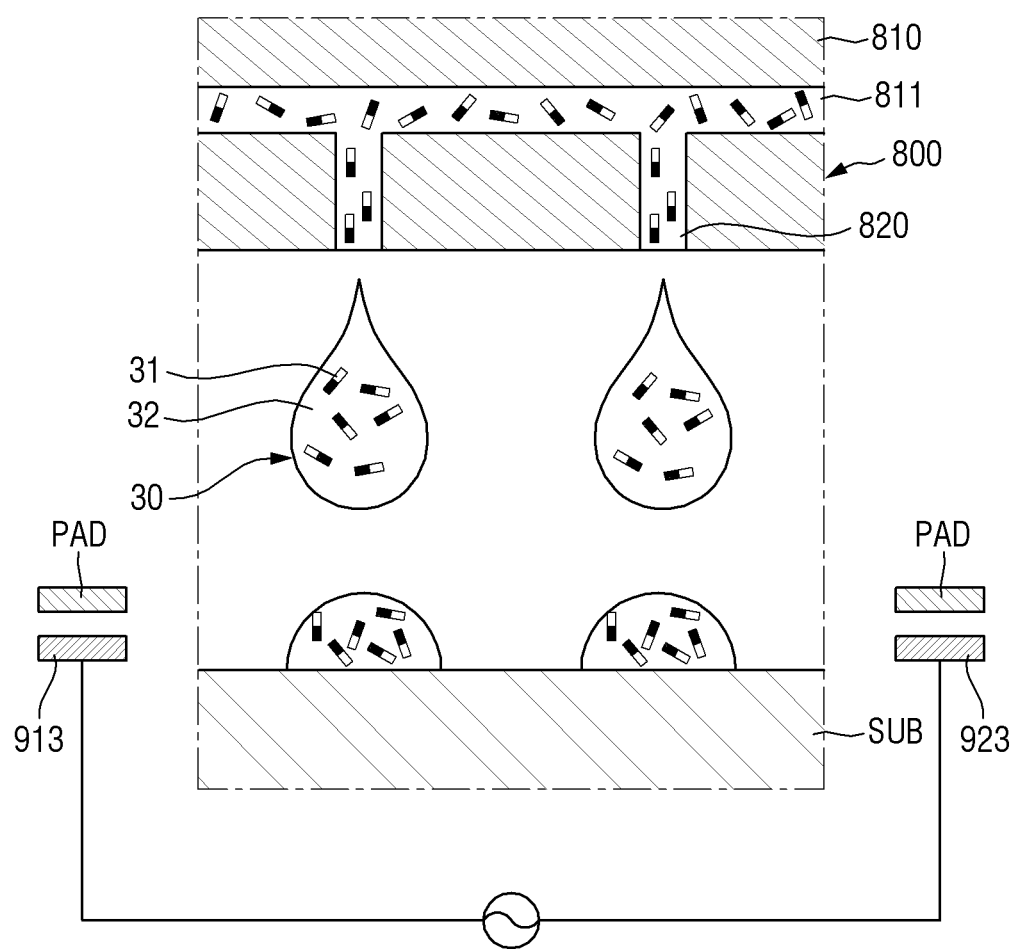
FIGS. 8 and 9 are partial schematic cross-sectional views illustrating orientation directions of dipoles in an ink according to the operation of the probe unit in the inkjet printing apparatus according to an embodiment.
Figure 9:
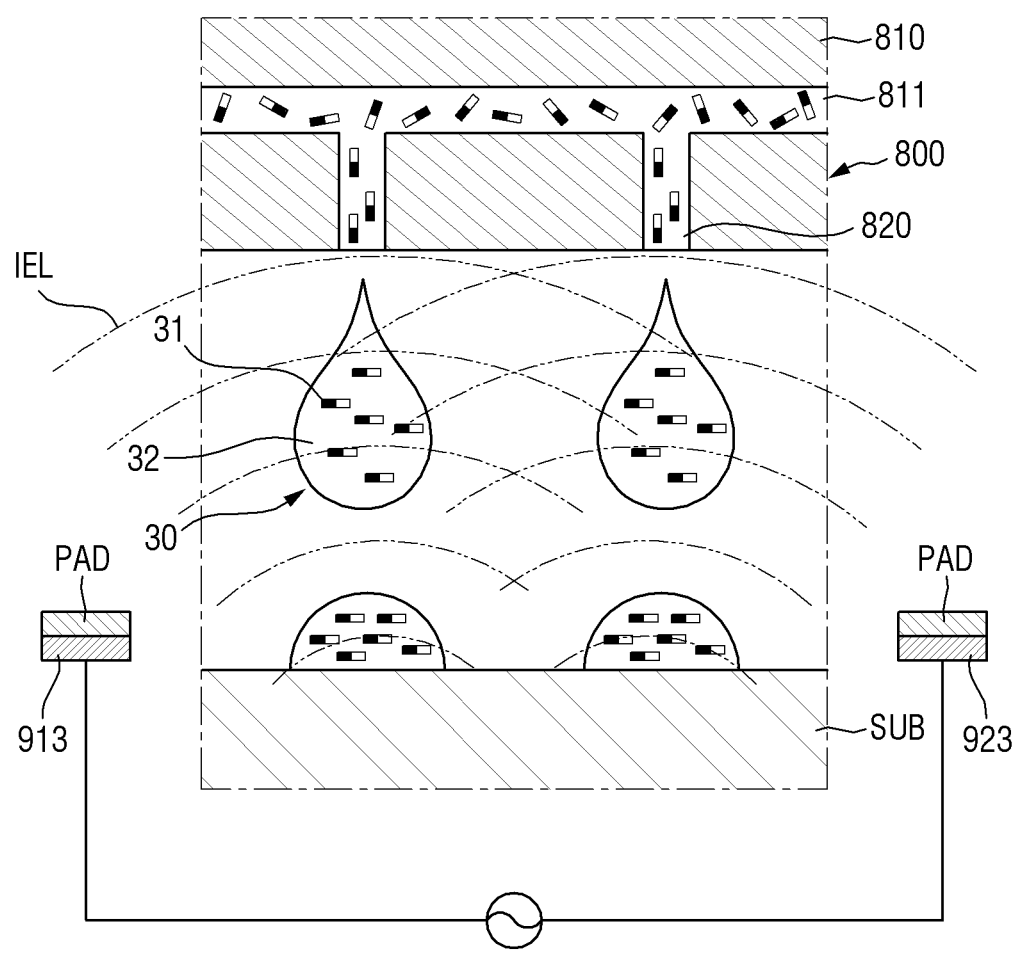

FIGS. 8 and 9 are partial schematic cross-sectional views illustrating orientation directions of the dipoles in the ink according to the operation of the probe unit in the inkjet printing apparatus according to an embodiment. For convenience of description, a detailed cross-sectional structure of the stage 710 except for the first probe 913 and the second probe 923 of the probe unit 900 and the inkjet head 800 is omitted in FIGS. 8 and 9.

The dipoles 31 in the ink 30 may have random orientation directions in case that no external force is applied. As shown in FIG. 8, in case that the first probe 913 and the second probe 923 to which power may be applied and the electrode pads PAD on the target substrate SUB may be spaced apart from each other and thus may not be electrically connected, since an electrical signal may not be transmitted to the electrode pads PAD, the electric field may not be generated. As such, in case that the electric field is not generated on the target substrate SUB, the orientation directions of the dipoles 31 may not be aligned in a specific direction until the ink is sprayed onto the target substrate SUB from the inkjet head 800. The orientation directions may be aligned to some extent in a direction while the dipoles 31 land on the target substrate SUB due to a subsequent process of landing the dipoles 31, such as dielectrophoresis, but in case that the orientation directions may be random in a state in which the ink is sprayed onto the target substrate SUB, there may be a difference in a degree in which the orientation direction may be changed for each dipole 31, and thus misalignment may occur or alignment may take a long time.

As shown in FIG. 9, in case that the first probe 913 and the second probe 923 to which power may be applied and the electrode pads PAD on the target substrate SUB come into contact with each other and are physically or electrically connected, the ink 30 may be influenced by the electric field IEL until the ink 30 may be delivered from the nozzles 820 of the inkjet head 800 to the target substrate SUB. In case that the dipoles 31 in the ink 30 are placed in the electric field IEL, since the dipoles 31 receive an electric force, the orientation directions may be toward an electric field direction. As shown in the drawings, in case that the electric field IEL by the first probe 913 and the second probe 923 is a vertical electric field IEL having an equipotential line in a horizontal direction, the dipoles 31 placed in the corresponding electric field IEL may also show a tendency of generally being oriented in a vertical direction. In case that the landing process is performed for the dipoles 31 aligned in a specific direction, since degrees in which the orientation directions may be changed become similar to each other compared to the dipoles 31 having random orientation directions, alignment accuracy of the dipoles 31 may be improved and quick alignment may be achieved.

Figure 10:
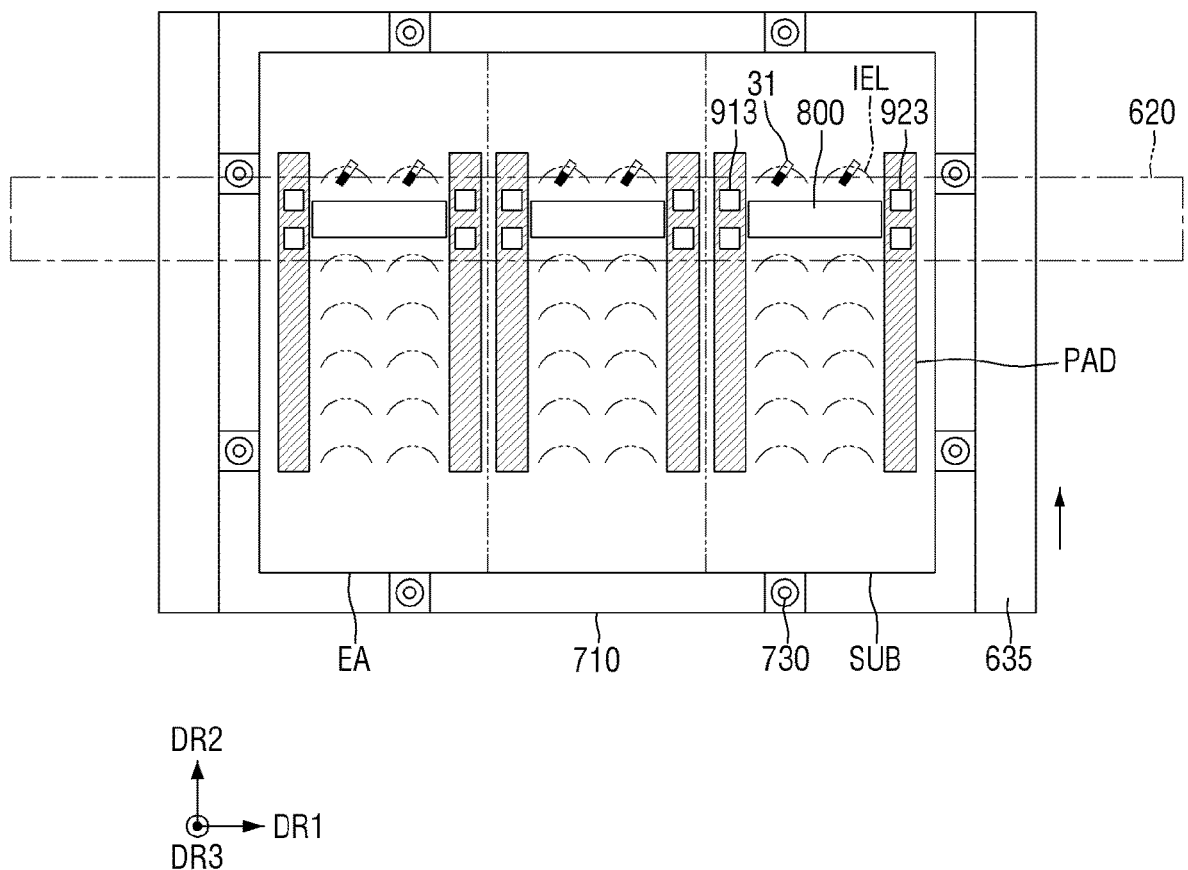
FIGS. 10 and 11 are plan views schematically illustrating the spraying of ink and electric field generation using the inkjet printing apparatus.
Figure 11:
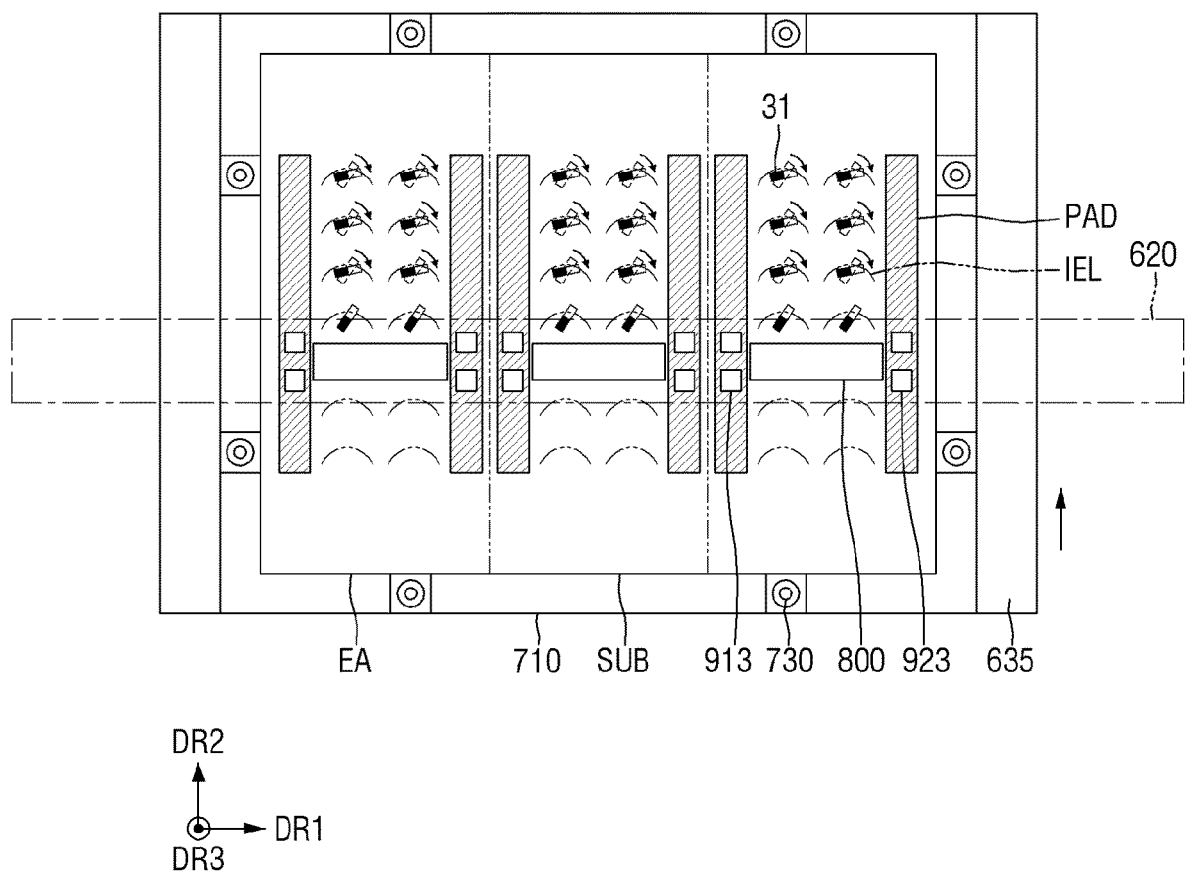

FIGS. 10 and 11 are plan views schematically illustrating the spraying of ink and electric field generation using the inkjet printing apparatus.

In FIG. 10, the inkjet heads 800 mounted on the frame 620 and the first probe member 910 and the second probe member 920 disposed at a side of the inkjet head 800 may be disposed above the stage 710. The first probe 913 of the first probe member 910 and the second probe 923 of the second probe member 920 may be located to respectively overlap the electrode pads PAD of the target substrate SUB in the third direction DR3. The first and second probes 913 and 923 may come into contact with the upper surfaces of the electrode pads PAD of the target substrate SUB and provide a voltage, for example, an alternating current voltage. Voltage application by the first and second probes 913 and 923 may be performed simultaneously or sequentially. Since the first and second probes 913 and 923 and the electrode pads PAD continuously come into contact with each other during the printing process, the electric field IEL may be continuously formed on the entire target substrate SUB while the printing process may be performed.

Referring to FIG. 11, in case that the spraying of the ink 30 on a first region of the target substrate SUB is completed, the stage 710 may move in the second direction DR2. The frame 620 may be located above a second region of the target substrate SUB on which the ink may not be sprayed. As described above, even while the stage 710 moves in the second direction DR2, as described above, the first and second probes 913 and 923 each formed in the roller shape may come into contact with the electrode pads PAD on the target substrate SUB, and may respectively rotate around the rotational shafts having extending directions parallel to the first direction DR1 perpendicular to the second direction DR2. Accordingly, the electric field IEL may be formed on the entire target substrate SUB. The dipoles 31 sprayed on the first region of the target substrate SUB may be aligned by the electric field IEL formed in the first region of the target substrate SUB.

In the above embodiment, the inkjet printing apparatus has been described as an example of an applying device, but it may be applied to various devices which apply a liquid solution, such as an inkjet injection device, a slot-die coating device, a slot-die printing device, and the like.

Hereinafter, another embodiment will be described. In the following embodiment, overlapping descriptions are omitted or simplified for the same components as the above description, and differences will be described.

Figure 12:
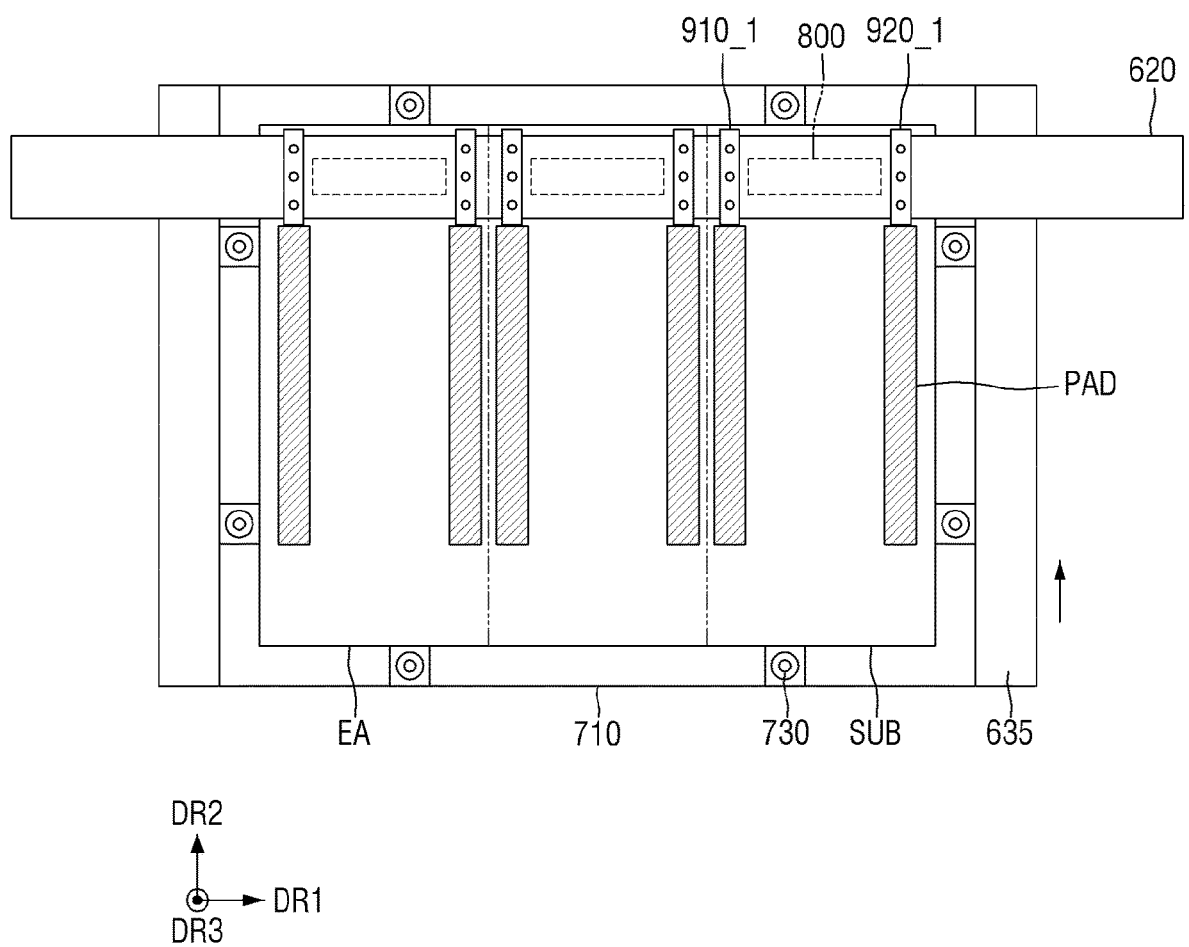
FIG. 12 is a partial schematic plan view of an inkjet printing apparatus according to another embodiment.
Figure 13:
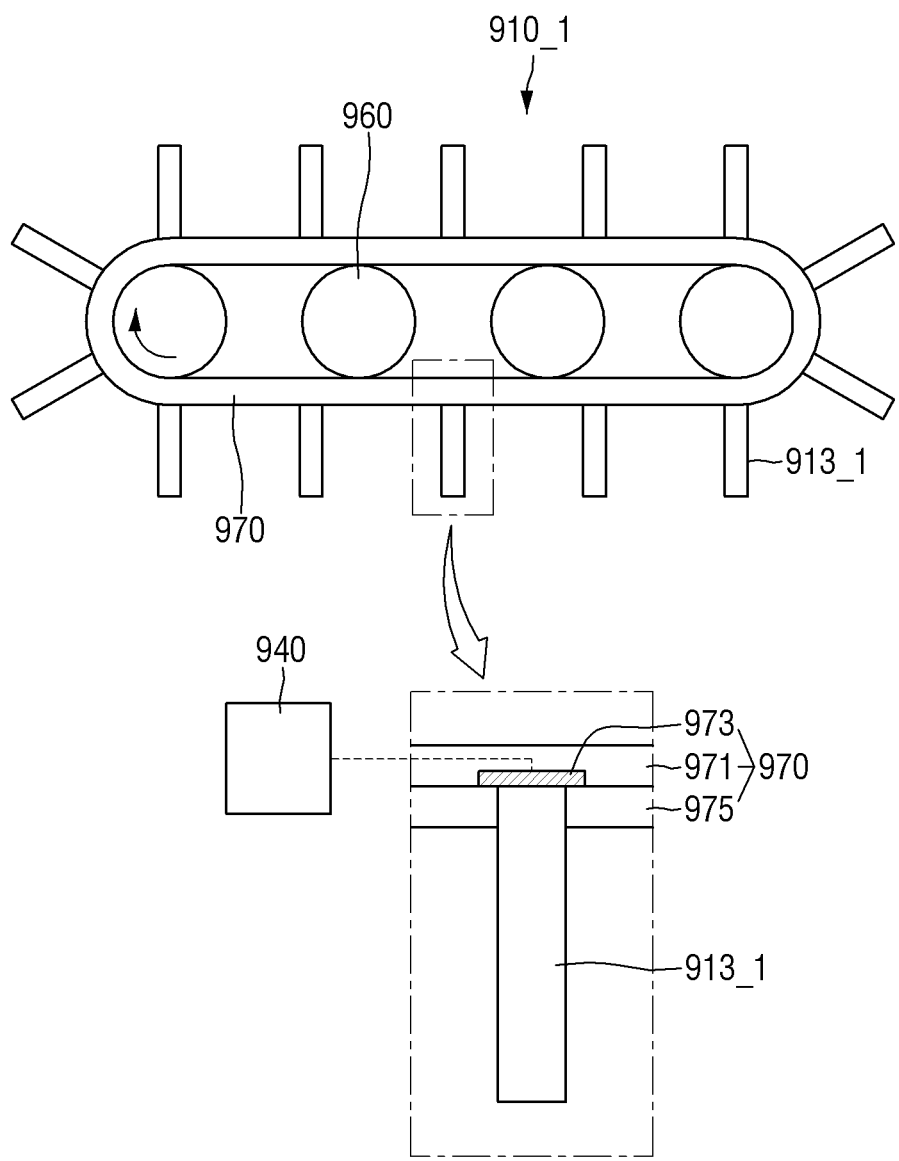
FIG. 13 is a schematic side view illustrating an example of a probe member of the inkjet printing apparatus in FIG. 12.
Figure 14:
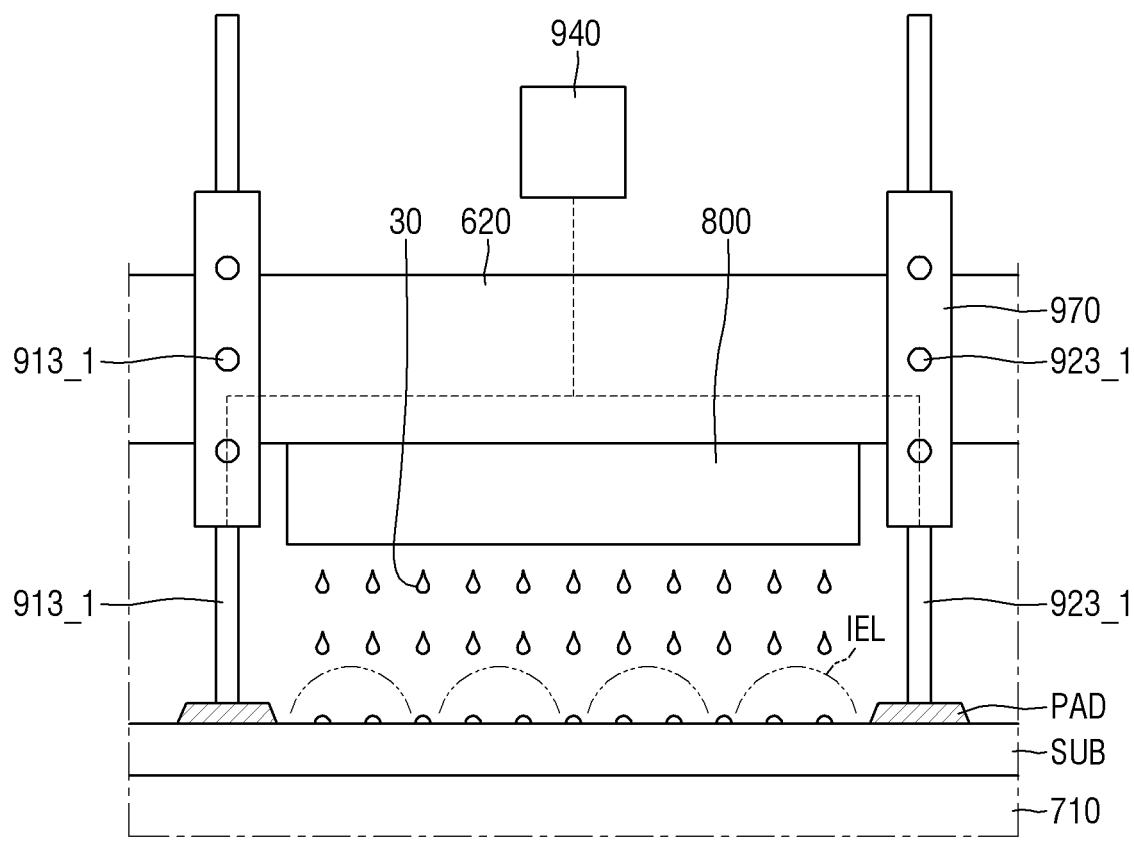
FIG. 14 is a partial schematic front view illustrating operations of an inkjet head and a probe member in the inkjet printing apparatus in FIG. 12.
Figure 15:
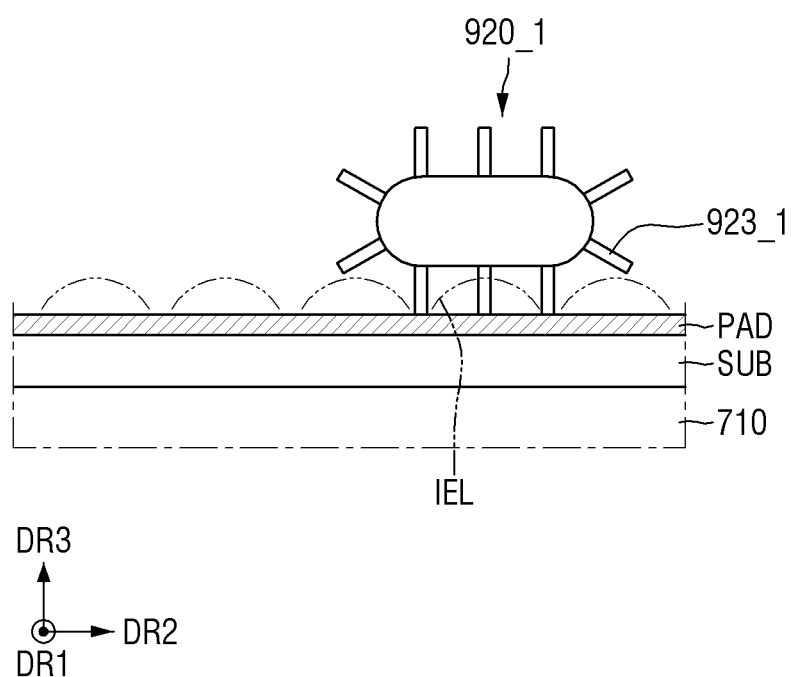
FIG. 15 is a partial schematic side view illustrating operations of the inkjet head and the probe member in the inkjet printing apparatus in FIG. 12.

FIG. 12 is a partial schematic plan view of an inkjet printing apparatus according to another embodiment. FIG. 13 is a schematic side view illustrating an example of a probe member of the inkjet printing apparatus in FIG. 12. FIG. 14 is a partial schematic front view illustrating operations of an inkjet head and a probe member in the inkjet printing apparatus in FIG. 12. FIG. 15 is a partial schematic side view illustrating operations of the inkjet head and the probe member in the inkjet printing apparatus in FIG. 12.

Referring to FIGS. 12 to 15, a probe member according to an embodiment may include pin-shaped probes and probe driving parts which move the probes. The probe member may further include a probe jig 970 on which the probes may be mounted. Hereinafter, only a configuration of a first probe member 910_1 according to an embodiment will be described, and the same may be applied to a second probe member.

The first probe member 910_1 may include at least one rotatable probe driving part 960. The probe driving part 960 may have a rotatable roller shape. Each probe driving part 960 may rotate with a rotational shaft, and an extending direction of the rotational shaft may be the first direction DR1 perpendicular to the second direction DR2 in which the stage 710 moves.

The probe jig 970 may be formed to surround the probe driving parts 960. The probe jig 970 may be formed in a closed loop shape to surround the probe driving parts 960. Accordingly, in case that the probe driving parts 960 rotate about the rotational shaft in the first direction DR1, the probe jig 970 may also rotate or linearly move in a rotating direction of the probe driving parts 960.

The probes 913_1 may be mounted on the probe jig 970. The probes 913_1 may be mounted on and fixed to at least one probe jig 970. The probes 913_1 may each be formed in a pin shape. The probes 913_1 may be disposed on the probe jig 970 to be spaced apart from each other. The probes 913_1 may be mounted on the probe jig 970, which rotates or linearly moves as the probe driving parts 960 rotate, and may move. Accordingly, in case that the stage 710 moves in the second direction DR2, the pin-shaped probes 913_1 may come into contact with the electrode pad PAD formed on the target substrate SUB while moving. Although not shown in the drawings, each of the pin-shaped probes 913_1 may further include a buffer member.

The probe jig 970 may include a circuit board 971, an electric field application pad 973 disposed on the circuit board 971, and a protective material 975. The probe 913_1 may be connected to the electric field application pad 973 disposed on the circuit board 971 to receive an electrical signal generated from the electric field generation device 940.

As described above, the first probe member 910_1 according to an embodiment may also transmit the electrical signal generated from the electric field generation device 940 to the target substrate SUB while coming into contact with the electrode pad PAD formed on the target substrate SUB in a direction above the target substrate SUB even while the stage 710 moves in a direction.

Hereinafter, a dipole alignment method using the inkjet printing apparatus according to the above-described various embodiments will be described.

Figure 16:
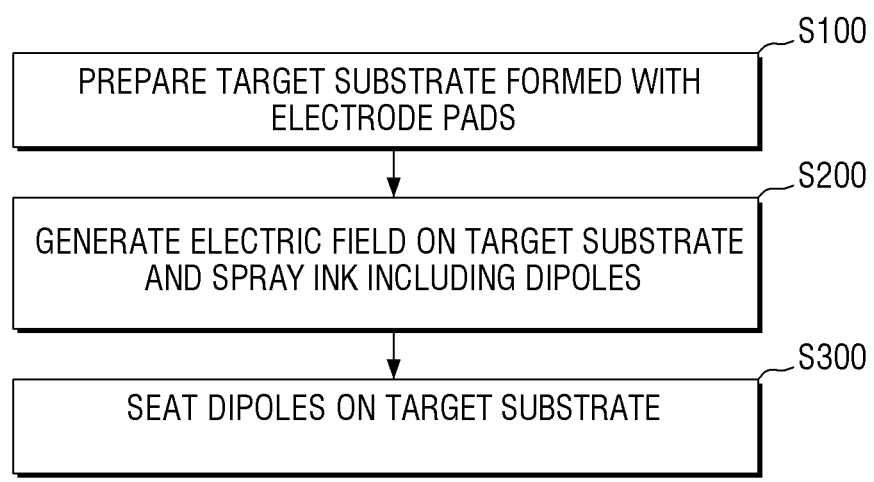
FIG. 16 is a schematic flow chart of a dipole alignment method according to an embodiment.
Figure 17:
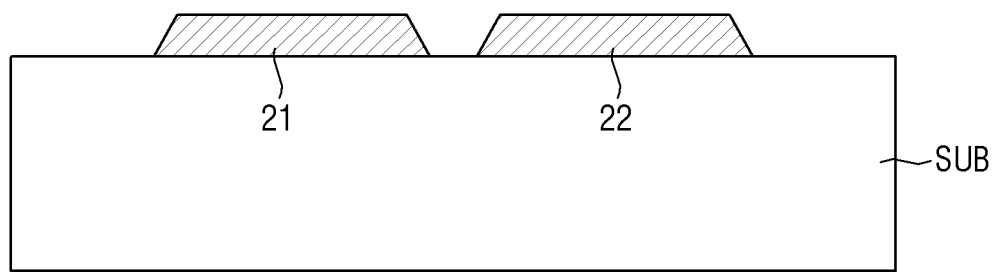
FIGS. 17 to 20 are schematic cross-sectional views for describing process steps of the dipole alignment method according to an embodiment.
Figure 17:
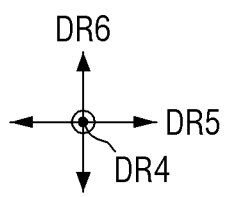
Figure 18:
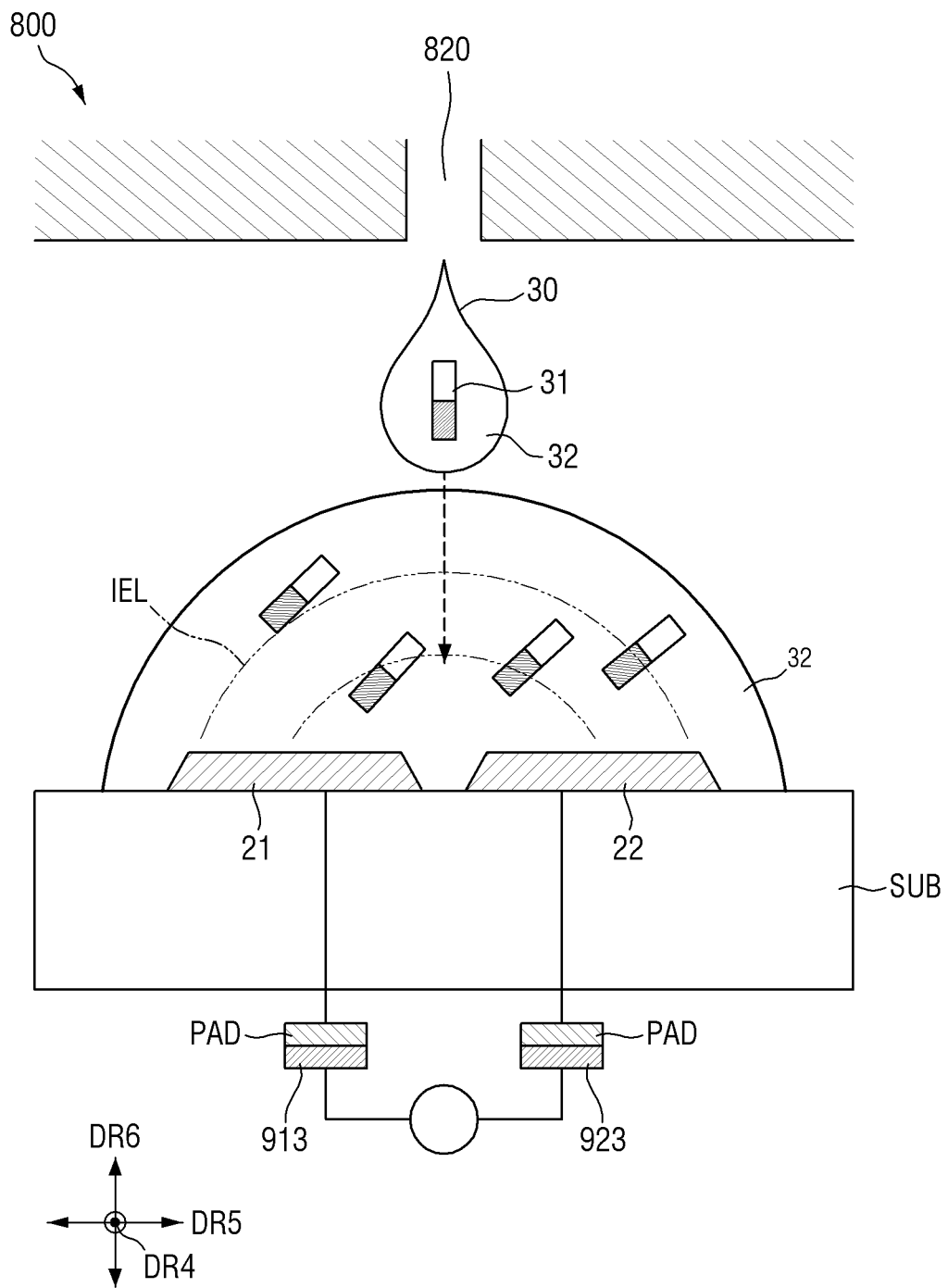
Figure 19:
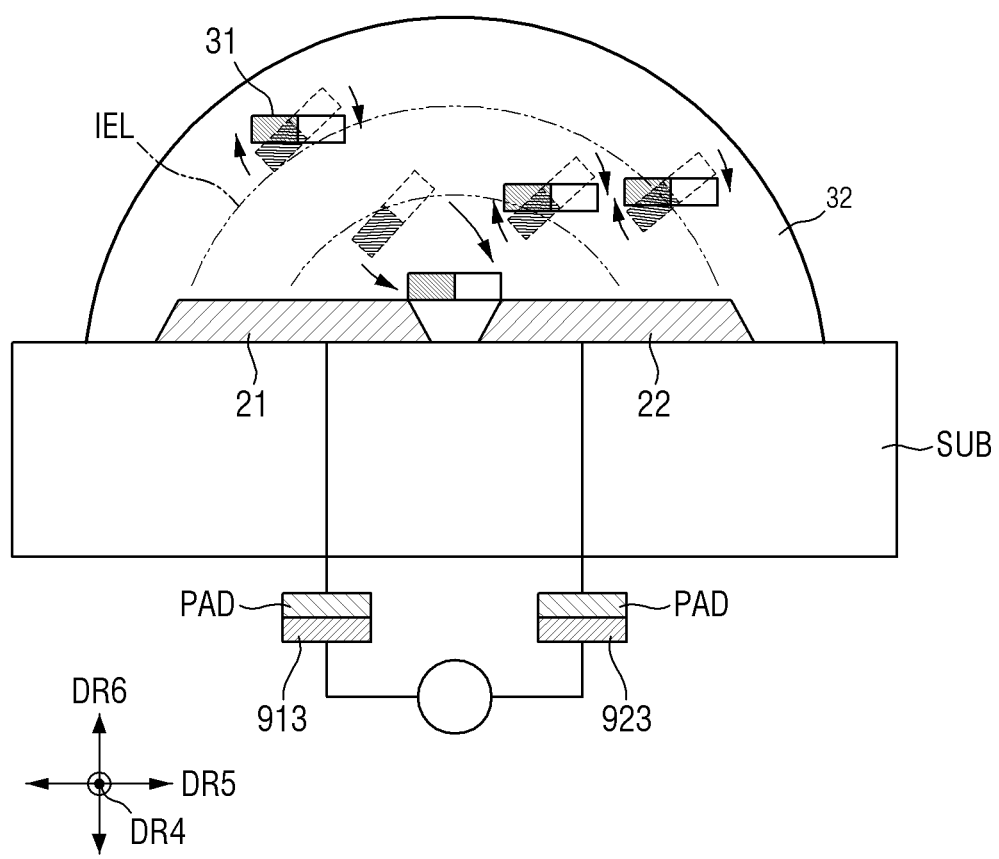

FIG. 16 is a schematic flow chart of the dipole alignment method according to an embodiment. FIGS. 17 to 20 are schematic cross-sectional views for describing process steps of the dipole alignment method according to an embodiment.

Referring to FIGS. 1 to 5, and 16, the dipole alignment method according to an embodiment may include an operation of preparing a target substrate on which electrode pads may be formed (S100), an operation of generating an electric field on the target substrate, and spraying an ink including dipoles (S200), and an operation of seating the dipoles on the target substrate (S300).

First, the target substrate SUB on which the electrode pads PAD may be formed may be prepared (S100, in FIG. 16).

Specifically, the operation of preparing the target substrate SUB on which the electrode pads PAD may be formed (S100) may include an operation of setting an inkjet printing apparatus 1000 and tuning the inkjet printing apparatus 1000 according to a target process, and an operation of preparing the target substrate SUB on a stage 710. An inkjet printing test process for an inspection substrate may be performed for precise tuning, and a set value of the inkjet printing apparatus 1000 may be adjusted according to the result.

The operation of setting the inkjet printing apparatus 1000 and tuning the inkjet printing apparatus 1000 according to the target process will be described in detail. First, the inspection substrate may be prepared. The inspection substrate may have the same structure as the target substrate SUB, but a bare substrate such as a glass substrate or the like may be used.

Subsequently, an upper surface of the inspection substrate may undergo water-repellent treatment. The water-repellent treatment may be performed with fluorine coating, plasma surface treatment, or the like, or a combination thereof.

Subsequently, an ink 30 including dipoles 31 may be applied on the upper surface of the inspection substrate using the inkjet printing apparatus 1000, and a droplet amount for each nozzle 820 may be measured. The measurement of the droplet amount for each nozzle 820 may be performed with a method of checking a size of the droplet at moment of spraying and a size of the droplet applied to the substrate using a camera. In case that the measured droplet amount is different from a reference droplet amount, the voltage for each nozzle 820 may be adjusted so that the reference droplet amount can be sprayed. This inspection method may be repeated several times until each nozzle 820 sprays the ink 30 in an accurate droplet amount.

The above-described operation of setting the inkjet printing apparatus 1000 and tuning the inkjet printing apparatus 1000 according to the target process may be omitted.

Subsequently, the setting of the inkjet printing apparatus 1000 may be completed, and the target substrate SUB may be prepared. As described above, the target substrate SUB may be aligned by an aligner 730 installed on the stage 710 to be disposed on the stage 710.

Specifically, referring to FIGS. 1 to 5, and FIGS. 16 and 17, a first electrode 21 and a second electrode 22 may be formed on the target substrate SUB. Although the drawing illustrates that a pair of electrodes are formed on the target substrate SUB, a larger number of electrode pairs may be formed on the target substrate SUB, and the inkjet heads 800 may spray the ink 30 onto the electrode pairs in the same manner to be described later.

Subsequently, the electric field may be generated on the target substrate, and the ink including the dipoles may be sprayed (S200, in FIG. 16).

Specifically, referring to FIGS. 1 to 5, and FIGS. 16 and 18, the electric field IEL may be generated on the target substrate SUB on which the first electrode 21 and the second electrode 22 may be formed, and the ink 30 including the dipoles 31 and a solvent 32 in which the dipoles 31 may be dispersed may be sprayed. The ink 30 may be discharged from the nozzle 820 of the inkjet head 800 described above, and the electric field IEL may be generated by the probe unit 900 described above.

More specifically, the ink 30 may be sprayed onto the first electrode 21 and the second electrode 22 formed on the target substrate SUB using the inkjet head 800. As described above, the electric field IEL may be generated on the target substrate SUB using the probe units 900, and as the ink 30 passes through a region where the electric field IEL may be generated, the orientation directions of the dipoles 31 in the solvent 32 may be aligned in a generally vertical direction.

A process of spraying the ink 30 onto the target substrate SUB may be performed using the inkjet head 800, and the electric field IEL may be generated on the target substrate SUB using the probe units 900. Specifically, an electrical signal may be applied to the first electrode 21 and the second electrode 22 using the probe units 900. In an embodiment, the electrical signal may be an alternating current voltage, and the alternating current voltage may have a voltage of ±(10 to 50) V and a frequency of 10 kHz to 1 MHz.

The alternating current voltage may be applied using the probe units 900. The probe unit 900 may include the electric field generation device 940 as described above, and the electric field generation device 940 may further include an amplifier and a function generator for generating an appropriate alternating current voltage. For example, the function generator may generate a signal in which a target alternating current waveform, frequency and the like may be reflected, and the amplifier amplifies the signal to an appropriate voltage, and the alternating current voltage may be provided to the first probe member 910 and the second probe member 920 of the probe unit 900.

The first electrode 21 and the second electrode 22 may be connected to the electrode pads PAD formed on at least one side of a unit cell EA defined on the target substrate SUB, and the alternating current voltage may be applied to the electrode pads PAD through the probe members 910 and 920 of the probe unit 900. In case that the probe unit 900 includes the first probe member 910 and the second probe member 920, the electrode pads PAD of the first electrode 21 and the second electrode 22 may also be provided at both sides of the unit cell EA on the target substrate SUB. The alternating current voltage may be applied to the electrode pad PAD at a side by the first probe 913 of the first probe member 910, and the alternating current voltage may be applied to the electrode pad PAD at another side by the second probe 923 of the second probe member 920. The first probe member 910 and the second probe member 920 may simultaneously apply the alternating current voltage, and the first probe member 910 and the second probe member 920 may sequentially apply the alternating current voltage.

In an embodiment, since the electrical signal may be applied while the first probe 913 of the first probe member 910 comes into contact with the upper surface of the electrode pad PAD at a side, and the second probe 923 of the second probe member 920 comes into contact with the upper surface of the electrode pad PAD at another side, the electric field IEL may be generated between the first electrode 21 and the second electrode 22.

Subsequently, the dipoles may be seated on the target substrate (S300, in FIG. 16).

Specifically, referring to FIGS. 1 to 5, and FIGS. 16 and 19, the dipoles 31 may be seated on the target substrate SUB by the electric field IEL generated by the probe units 900. In some embodiments, the dipoles 31 may receive a dielectrophoretic force by the electric field IEL generated on the target substrate SUB and may be disposed between the first electrode 21 and the second electrode 22.

The electric field IEL generated on the target substrate SUB by the probe units 900 may be formed even after the ink 30 may be sprayed onto the target substrate SUB. Even after the ink 30 may be sprayed onto the target substrate SUB, the dipoles 31 receive the dielectrophoretic force by the electric field IEL formed on the target substrate SUB. As shown in FIG. 29, while the orientation directions and positions of the dipoles 31 which receive the dielectrophoretic force change little by little, finally, at least one of both end portions may be disposed on at least one of the first electrode 21 and the second electrode 22. However, the disclosure is not limited thereto, and the dipoles 31 may be directly disposed on the target substrate SUB between the first electrode 21 and the second electrode 22.

As described above, since the electric field IEL may be generated using the probe units 900 and the ink 30 may be sprayed onto the region of the target substrate SUB where the electric field IEL may be formed, the orientation directions of the dipoles 31 may already be generally aligned in a specific direction by the electric field IEL, and thus movement by the dielectrophoretic force may be substantially similarly performed. Accordingly, the alignment accuracy of the seated dipoles 31 may be increased.

Figure 20:
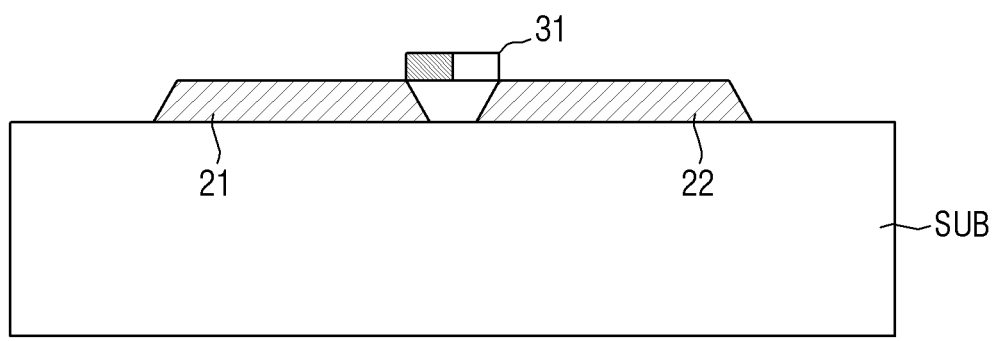
Figure 20:
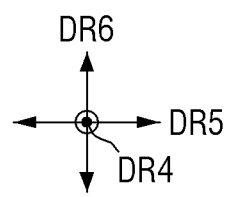

Subsequently, as shown in FIG. 20, the solvent 32 of the ink 30 may be removed. The solvent 32 of the ink 30 may be removed by volatilization or vaporization. As the solvent 32 may be removed, flowing between the dipoles 31 and each electrode may be prevented, and a mutual bonding force may be increased. As a result of the above, the dipoles 31 may be accurately aligned between the first electrode 21 and the second electrode 22.

The dipole alignment method according to an embodiment may be performed using the above-described inkjet printing apparatus. In the above-described dipole alignment method, since the electric field may be generated on the target substrate SUB using the probe units 900 of the inkjet printing apparatus 1000, and the dipoles 31 may be sprayed onto the target substrate SUB through the inkjet heads 800, the dipoles 31 discharged from the inkjet heads 800 may be oriented in an arbitrary direction on the target substrate SUB. The dipoles 31 may be aligned in a direction by the electric field IEL generated on the target substrate SUB.

The method of aligning the inkjet printing apparatus 1000 and the dipoles 31 as described above may be used to manufacture a display device including a light emitting element, which may be a type of the dipole 31. Hereinafter, the above will be described in detail.

Figure 21:
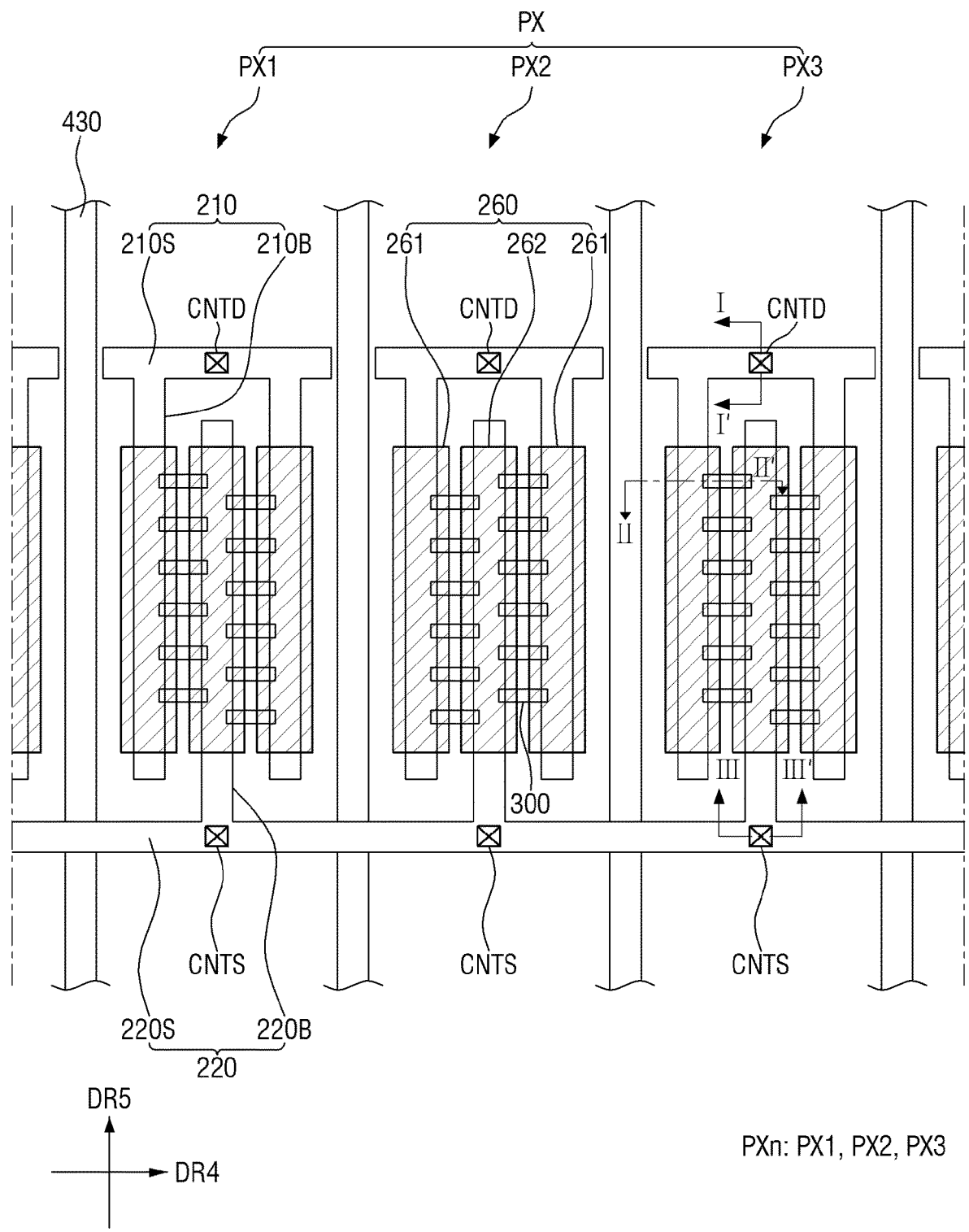
FIG. 21 is a schematic plan view of a display device manufactured by the method according to an embodiment.

FIG. 21 is a schematic plan view of the display device manufactured by the method according to an embodiment.

Referring to FIG. 21, a display device 10 may include pixels PX. The pixels PX may emit light of a specific wavelength to the outside of the display device. The pixels PX may be arranged in a matrix form. Each of the pixels PX may include three sub-pixels PX1, PX2, and PX3 which emit different colors, that is, a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. The first color may be blue, the second color may be green, and the third color may be red, but the disclosure is not limited thereto, and the sub-pixels PXn may emit light of the same color. Further, although an example in which the pixel PX includes three sub-pixels PXn is shown in FIG. 21, the disclosure is not limited thereto, and the pixel PX may include a larger number of sub-pixels PXn. The sub-pixels PXn may be alternately arranged along rows and columns.

Each pixel PX may include one or more light emitting elements 300. The sub-pixels PXn which display different colors may respectively include the light emitting elements 300 which emit different colors. For example, the first sub-pixel PX1 may include a light emitting element 300 which emits red light, the second sub-pixel PX2 may include a light emitting element 300 which emits green light, and the third sub-pixel PX3 may include a light emitting element 300 which emits blue light. However, the disclosure is not limited thereto, and in some cases, the sub-pixels PX1, PX2, and PX3 which display different colors may include the light emitting elements 300 which emit the same color (for example, blue), and the color of each sub-pixel may be realized by arranging a wavelength conversion layer or a color filter on a light emitting path.

Each light emitting element 300 may include a semiconductor layer doped with an arbitrary conductivity type (for example, p-type or n-type) impurity. Each light emitting element 300 may include a semiconductor of which an end portion may be doped with a p-type (or n-type) impurity and another end portion may be doped with an n-type (or p-type) impurity which may be the opposite conductivity type. For example, the light emitting element 300 may be a type of dipole.

The display device may include electrodes 210 and 220. At least portions of the electrodes 210 and 220 may be disposed in each of the sub-pixels PX1, PX2, and PX3 to be electrically connected to the light emitting element 300, and may apply an electrical signal to the light emitting element 300 so that the light emitting element 300 may emit a specific color.

Further, at least portions of the electrodes 210 and 220 may be used to form an electric field in each of the sub-pixels PX1, PX2, and PX3 to align the light emitting element 300. In case that the light emitting element 300, which may be a type of dipole, may be aligned, the electric field may be generated between the first electrode 210 and the second electrode 220 by applying alternating current power to each of the electrodes 210 and 220.

The electrodes 210 and 220 may include a first electrode 210 and a second electrode 220. In an embodiment, the first electrode 210 may be a pixel electrode separated for each sub-pixel PX, and the second electrode 220 may be a common electrode commonly connected along the sub-pixels PX. One of the first electrode 210 and the second electrode 220 may be an anode electrode of the light emitting element 300, and the other may be a cathode electrode of the light emitting element 300. However, the disclosure is not limited thereto, and vice versa.

The first electrode 210 and the second electrode 220 may include electrode stem portions 210S and 220S disposed to extend in a fourth direction DR4, respectively, and one or more electrode branch portions 210B and 220B extending and branching from the electrode stem portions 210S and 220S in a fifth direction DR5 that may be a direction intersecting the fourth direction DR4, respectively.

Specifically, the first electrode 210 may include a first electrode stem portion 210S disposed to extend in the fourth direction DR4, and at least one first electrode branch portion 210B branching from the first electrode stem portion 210S and extending in the fifth direction DR5. Although not shown in the drawings, in the first electrode stem portion 210S, an end portion may be connected to the electrode pad PAD, and another end portion may extend in the fourth direction DR4, and may be electrically disconnected between the sub-pixels PX. The alternating current power may be applied to the electrode pads PAD as the probe 930 of the above-described probe unit 900 comes into contact with the electrode pad PAD.

The first electrode stem portion 210S of an arbitrary sub-pixel may have both ends separated and terminated between the neighboring sub-pixels PXn which belong to the same row (for example, adjacent in the fourth direction DR4), and may lie on the substantially same straight line as the first electrode stem portion 210S of the sub-pixel PXn belonging to the same row. In other words, both ends of the first electrode stem portion 210S of one sub-pixel PXn may be separated and terminated between the sub-pixels PXn, and the first electrode stem portion 210S of the neighboring sub-pixel may be aligned on an extending line of the first electrode stem portion 210S of the one sub-pixel.

Such disposition of the first electrode stem portion 210S may be formed by forming as one connected stem electrode during the manufacturing process, and disconnecting through a laser or the like after performing an alignment process of the light emitting element 300. Accordingly, since both ends of the first electrode stem portions 210S disposed in the respective sub-pixel PXn may be spaced apart from each other, the first electrode stem portions 210S disposed in the sub-pixels PXn may apply different electrical signals to the first electrode branch portions 210B, respectively, and the first electrode branch portions 210B disposed in the sub-pixels PXn may be separately driven.

The first electrode branch portion 210B may be branched from at least a portion of the first electrode stem portion 210S, may be disposed to extend in the fifth direction DR5, and may be terminated in a state of being spaced apart from a second electrode stem portion 220S disposed to face the first electrode stem portion 210S. For example, the first electrode branch portion 210B may be disposed in the sub-pixel PXn in a state in which an end portion may be connected to the first electrode stem portion 210S, and another end portion may be spaced apart from the second electrode stem portion 220S. Since the first electrode branch portions 210B may be connected to the first electrode stem portions 210S electrically separated for each of the sub-pixels PXn, the sub-pixels PXn may receive different electrical signals.

Further, one or more first electrode branch portions 210B may be disposed in each sub-pixel PXn. FIG. 21 illustrates that two first electrode branch portions 210B are disposed and one second electrode branch portion 220B may be disposed therebetween, but the disclosure is not limited thereto, and a larger number of first electrode branch portions 210B may be disposed. The first electrode branch portions 210B may be alternately disposed to be spaced apart from second electrode branch portions 220B, and light emitting elements 300 may be disposed therebetween. In some embodiments, since the second electrode branch portion 220B may be disposed between the first electrode branch portions 210B, each sub-pixel PXn may have a symmetrical structure with respect to the second electrode branch portion 220B. However, the disclosure is not limited thereto.

The second electrode 220 may include the second electrode stem portion 220S extending in the fourth direction DR4 and disposed to be spaced apart from the first electrode stem portion 210S to face the first electrode stem portion 210S, and at least one second electrode branch portion 220B branching from the second electrode stem portion 220S and extending in the fifth direction DR5 to be disposed to be spaced apart from and face the first electrode branch portion 210B. The second electrode stem portion 220S may also have an end portion connected to the electrode pad PAD like the first electrode stem portion 210S. Unlike the first electrode stem portion 210S, another end portion of the second electrode stem portion 220S may extend to the sub-pixels PXn adjacent in the fourth direction DR4. For example, the second electrode stem portion 220S may be electrically connected between the sub-pixels PXn. Accordingly, both ends of the second electrode stem portion 220S of an arbitrary sub-pixel may be connected to ends of the second electrode stem portions 220S of neighboring sub-pixels between the sub-pixels PXn, and thus the same electrical signal may be applied to the sub-pixels PXn.

The second electrode branch portion 220B may be branched from at least a portion of the second electrode stem portion 220S, may be disposed to extend in the fifth direction DR5, and may be terminated in a state of being spaced apart from the first electrode stem portion 210S. For example, the second electrode branch portion 220B may be disposed in the sub-pixel PXn in a state in which an end portion may be connected to the second electrode stem portion 220S, and another end portion may be spaced apart from the first electrode stem portion 210S. Since the second electrode branch portions 220B may be connected to the second electrode stem portions 220S electrically connected for the sub-pixels PXn, the sub-pixels PXn may receive the same electrical signal.

Further, the second electrode branch portion 220B and the first electrode branch portion 210B may be disposed to be spaced apart from and face each other. Here, since the first electrode stem portion 210S and the second electrode stem portion 220S may be spaced apart from and face each other in opposite directions with respect to a center of each sub-pixel PXn, the first electrode branch portion 210B and the second electrode branch portion 220B may extend in opposite directions from the first electrode stem portion 210S and the second electrode stem portion 220S, respectively. In other words, since the first electrode branch portion 210B extends in another direction of the fifth direction DR5, and the second electrode branch portion 220B extends in a direction in the fifth direction DR5, an end portion of the first electrode branch portion 210B and the second electrode branch portion 220B may be disposed in opposite directions with respect to the center of the sub-pixel PXn. However, the disclosure is not limited thereto, and the first electrode stem portion 210S and the second electrode stem portion 220S may be disposed to be spaced apart from each other in the same direction with respect to the center of the sub-pixel PXn. The first electrode branch portion 210B and the second electrode branch portion 220B respectively branching from the electrode stem portions 210S and 220S may extend in the same direction.

FIG. 21 illustrates that one second electrode branch portion 220B is disposed in each sub-pixel PXn, but the disclosure is not limited thereto, and a larger number of second electrode branch portions 220B may be disposed.

The light emitting elements 300 may be aligned between the first electrode branch portion 210B and the second electrode branch portion 220B. Specifically, in at least some of the light emitting elements 300, an end portion may be electrically connected to the first electrode branch portion 210B and another end portion may be electrically connected to the second electrode branch portion 220B. The light emitting elements 300 may be aligned on a large-area target substrate SUB by the above-described dipole alignment method, and may have excellent alignment accuracy even in an inner region of the target substrate SUB.

Each of the light emitting elements 300 may be disposed between the first electrode 210 and the second electrode 220. An end portion of the light emitting element 300 may be electrically connected to the first electrode 210, and another end portion of the light emitting element 300 may be electrically connected to the second electrode 220. Specifically, in the light emitting element 300, an end portion and another end portion may be electrically connected to the first electrode 210 and the second electrode 220, respectively, through contact electrodes 260 to be described later.

The light emitting elements 300 may be spaced apart from each other in the fifth direction DR5, and may be aligned substantially parallel to each other. An interval at which the light emitting elements 300 may be spaced apart from each other is not specifically limited. In some cases, the light emitting elements 300 may be disposed to be adjacent to each other to form a group, and other light emitting elements 300 may form a group in a state of being spaced apart from each other by an interval, and may be oriented and aligned in a direction with a non-uniform density. FIG. 21 illustrates that extending directions of the light emitting elements 300 disposed on the first electrode 210 and the second electrode 220 may be substantially perpendicular to the extending directions of the first electrode branch portion 210B and the second electrode branch portion 220B, but the disclosure is not limited thereto. For example, the extending direction of each of the light emitting elements 300 disposed between the first electrode 210 and the second electrode 220 may be disposed to be oblique instead of being perpendicular to the extending direction of the first electrode branch portion 210B and the second electrode branch portion 220B.

The contact electrode 260 may be disposed on each of the first electrode branch portion 210B and the second electrode branch portion 220B. The contact electrodes 260 may be disposed to extend in the fifth direction DR5, and may be disposed to be spaced apart from each other in the fourth direction DR4. The contact electrodes 260 may include a first contact electrode 261 which may be disposed on the first electrode branch portion 210B, and comes into contact with the end portion of the light emitting element 300, and a second contact electrode 262 which may be disposed on the second electrode branch portion 220B, and comes into contact with another end portion of the light emitting element 300.

The first electrode stem portion 210S and the second electrode stem portion 220S may be electrically connected to a thin film transistor to be described later (120, see FIG. 22) or a power source line (161, see FIG. 22) through a first electrode contact hole CNTD and a second electrode contact hole CNTS. FIG. 21 illustrates that the contact holes on the first electrode stem portion 210S and the second electrode stem portion 220S may be disposed for each sub-pixel PXn, but the disclosure is not limited thereto. As described above, since the second electrode stem portion 220S may extend to be electrically connected to adjacent sub-pixel PXn, in some embodiments, the second electrode stem portion 220S may be electrically connected to the thin film transistor through a contact hole.

An outer bank 430 may be disposed at a boundary between the sub-pixels PXn. For example, the outer bank 430 may extend in the fifth direction DR5, and may be disposed at the boundary between the sub-pixels PXn arranged to be adjacent in the fourth direction DR4. In the first electrode stem portion 210S of one sub-pixel PXn, end portions may be spaced apart from each other with respect to the outer bank 430 to be terminated. However, the disclosure is not limited thereto, and the outer bank 430 may extend in the fourth direction DR4, and may be disposed at the boundary between the sub-pixels PXn arranged to be adjacent in the fifth direction DR5. The outer bank 430 may be simultaneously formed in one process by including the same material as inner banks to be described later (410 and 420, see FIG. 22).

In manufacturing the display device, the outer bank 430 may perform a function of preventing an ink from crossing the boundary between the sub-pixels PXn in case that an ink in which the light emitting elements may be dispersed is sprayed using the above-described inkjet printing apparatus 1000 in FIG. 1. The outer bank 430 may separate inks in which light emitting elements 300 different from each other may be dispersed for each of the different sub-pixels PXn so that the inks may not be mixed with each other. However, the disclosure is not limited thereto.

Figure 22:
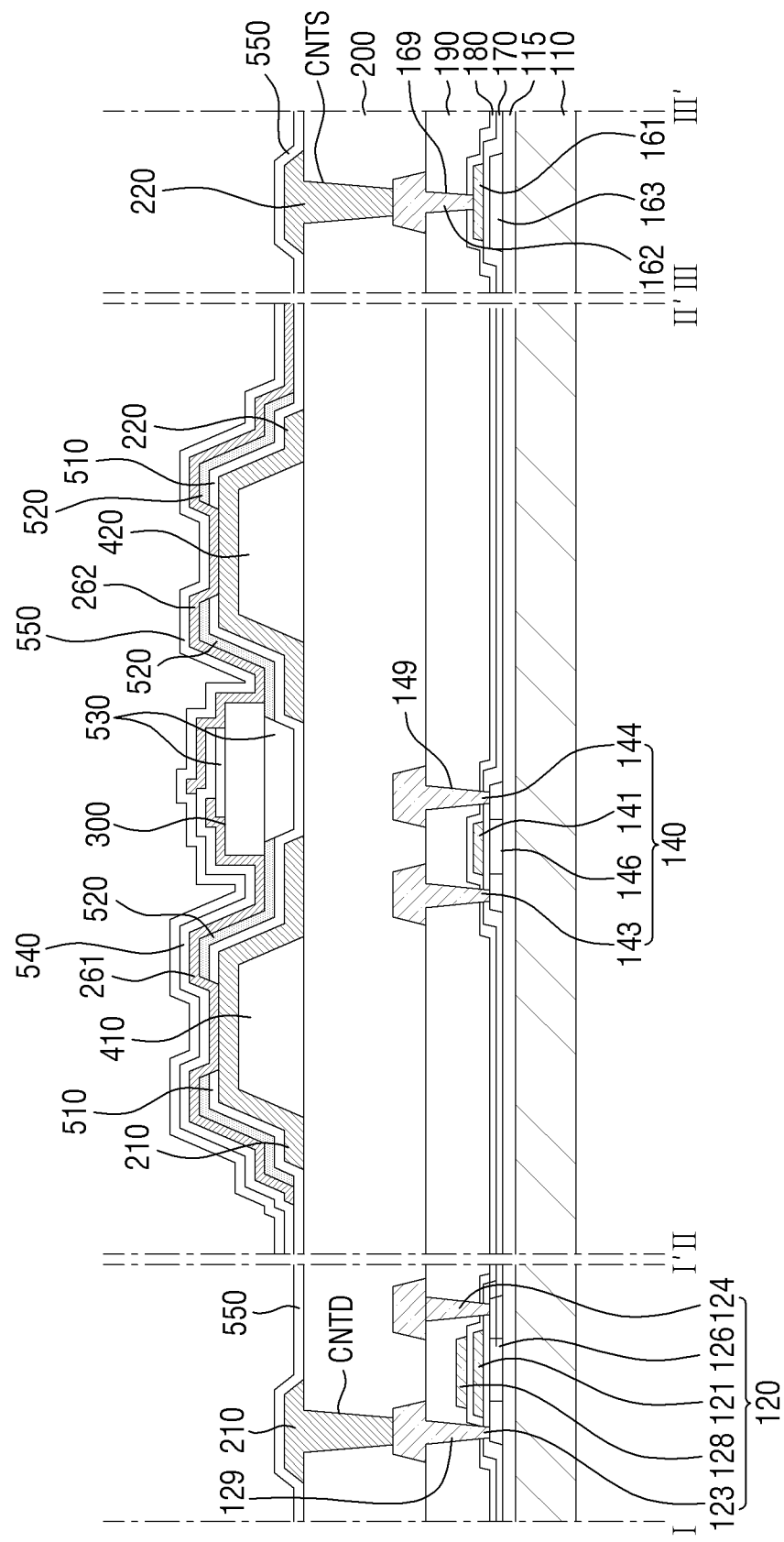
FIG. 22 is a schematic cross-sectional view taken along lines I-I', and in FIG. 21.

FIG. 22 is a schematic cross-sectional view taken along lines I-I', and in FIG. 21.

Although only a cross section of the third sub-pixel PX3 is shown in FIG. 22, the same may be applied to other pixels PX or sub-pixels PXn.

Referring to FIGS. 21 and 22, the display device may include a substrate 110, one or more thin film transistors 120 and 140 disposed on the substrate 110, and electrodes 210 and 220 and a light emitting element 300 disposed above the thin film transistors 120 and 140. The thin film transistors may include a first thin film transistor 120 which may be a driving transistor which transmits a driving signal to the first electrode 210. The thin film transistors may further include a second thin film transistor 140. The second thin film transistor 140 may be a switching transistor which transmits a data signal, but is not limited thereto. Each of the thin film transistors 120 and 140 may include an active layer, a gate electrode, a source electrode, and a drain electrode. The first electrode 210 may be electrically connected to a first drain electrode 123 of the first thin film transistor 120.

In a more detailed description of a cross-sectional structure of the display device, the substrate 110 may be an insulating substrate. The substrate 110 may be formed of an insulating material such as glass, quartz, a polymer resin, or the like, or a combination thereof. Examples of the polymer material may include polyethersulfone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. The substrate 110 may be a rigid substrate, but may also be a flexible substrate which may be bent, folded, rolled, or the like, or a combination thereof.

A buffer layer 115 may be disposed on the substrate 110. The buffer layer 115 may prevent the diffusion of impurity ions, prevent the permeation of moisture or external air, and perform a surface planarization function. The buffer layer 115 may include silicon nitride, silicon oxide, silicon oxynitride, or the like, or a combination thereof.

A semiconductor layer may be disposed on the buffer layer 115. The semiconductor layer may include a first active layer 126 of the first thin film transistor 120, a second active layer 146 of the second thin film transistor 140, and an auxiliary layer 163. The semiconductor layer may include polycrystalline silicon, single crystal silicon, an oxide semiconductor, or the like, or a combination thereof.

A first gate insulating layer 170 may be disposed on the semiconductor layer. The first gate insulating layer 170 may completely cover the semiconductor layer. The first gate insulating layer 170 may function as a gate insulating film of the thin film transistor. The first gate insulating layer 170 may include silicon oxide, silicon nitride, silicon oxynitride, aluminum oxide, tantalum oxide, hafnium oxide, zirconium oxide, titanium oxide, or the like, or a combination thereof. These may be used alone or in combination with each other.

A first conductive layer may be disposed on the first gate insulating layer 170. The first conductive layer may include a first gate electrode 121 disposed on the first active layer 126 of the first thin film transistor 120 with the first gate insulating layer 170 therebetween, and a second gate electrode 141 disposed on the second active layer 146 of the second thin film transistor 140, and a power source line 161 disposed on the auxiliary layer 163. The first conductive layer may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer may be a single film or a multilayer film.

A second gate insulating layer 180 may be disposed on the first conductive layer. The second gate insulating layer 180 may be an interlayer insulating film. The second gate insulating layer 180 may be formed of an inorganic insulating material such as silicon oxide, silicon nitride, silicon oxynitride, hafnium oxide, aluminum oxide, titanium oxide, tantalum oxide, zinc oxide, or the like, or a combination thereof.

A second conductive layer may be disposed on the second gate insulating layer 180. The second conductive layer may include a capacitor electrode 128 disposed on the first gate electrode 121 with the second gate insulating layer therebetween. The capacitor electrode 128 may form a storage capacitor with the first gate electrode 121.

The second conductive layer may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer may be a single film or a multilayer film.

An interlayer insulating layer 190 may be disposed on the second conductive layer. The interlayer insulating layer 190 may be an interlayer insulating film. Furthermore, the interlayer insulating layer 190 may perform a surface planarization function. The interlayer insulating layer 190 may include an organic insulating material such as an acrylic resin, an epoxy resin, a phenolic resin, a polyamide resin, a polyimide resin, an unsaturated polyester resin, a polyphenylene ether resin, a polyphenylene sulfide resin, benzocyclobutene (BCB), or the like, or a combination thereof.

A third conductive layer may be disposed on the interlayer insulating layer 190. The third conductive layer may include a first drain electrode 123 and a first source electrode 124 of the first thin film transistor 120, a second drain electrode 143 and a second source electrode 144 of the second thin film transistor 140, and a power source electrode 162 disposed on the power source line 161.

Each of the first source electrode 124 and the first drain electrode 123 may be electrically connected to the first active layer 126 through a first contact hole 129 passing through the interlayer insulating layer 190, the second gate insulating layer 180, and the first gate insulating layer 170. Each of the second source electrode 144 and the second drain electrode 143 may be electrically connected to the second active layer 146 through a second contact hole 149 passing through the interlayer insulating layer 190, the second gate insulating layer 180, and the first gate insulating layer 170. The power source electrode 162 may be electrically connected to the power source line 161 through a third contact hole 169 passing through the interlayer insulating layer 190 and the second gate insulating layer 180.

The third conductive layer may include one or more metals selected from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The third conductive layer may be a single film or a multilayer film. For example, the third conductive layer may be formed in a stacked structure of Ti/Al/Ti, Mo/Al/Mo, Mo/AlGe/Mo, Ti/Cu, or the like.

A via layer 200 may be disposed on the third conductive layer. The via layer 200 may be formed of an organic material such as an acrylic resin, an epoxy resin, a phenolic resin, a polyamide resin, a polyimide resin, an unsaturated polyester resin, a polyphenylene ether resin, a polyphenylene sulfide resin, benzocyclobutene (BCB), or the like, or a combination thereof. A surface of the via layer 200 may be flat. The via layer 200 may serve as a base layer on which the first electrode 210, the second electrode 220, and the light emitting element 300 may be disposed.

Inner banks 410 and 420 may be disposed on the via layer 200. The inner banks 410 and 420 may be disposed to be spaced apart from and face each other in each sub-pixel PXn, and the first electrode 210 and the second electrode 220 may be respectively disposed on the inner banks 410 and 420 which may be spaced apart from each other, for example, a first inner bank 410 and a second inner bank 420.

The first inner bank 410 and the second inner bank 420 may be disposed to extend in the fifth direction DR5 in each sub-pixel PXn. However, the disclosure is not limited thereto, and the first inner bank 410 and the second inner bank 420 may be disposed for each sub-pixel PXn to form a pattern on an entire surface of the display device. The inner banks 410 and 420 may be formed of substantially the same material and thus may be formed in one process. The inner banks 410 and 420 may include polyimide (PI).

Each of the first inner bank 410 and the second inner bank 420 may have a structure protruding in a thickness direction with respect to the via layer 200. The first inner bank 410 and the second inner bank 420 may protrude upward with respect to a plane where the light emitting element 300 may be disposed, and the protruding portion may be partially inclined. Since the first inner bank 410 and the second inner bank 420 protrude with respect to the via layer 200 and have inclined side surfaces, light emitted from the light emitting element 300 may be reflected from the inclined side surfaces of the inner banks 410 and 420. As will be described later, in case that the electrodes 210 and 220 disposed on the inner banks 410 and 420 include a material having high reflectivity, the light emitted from the light emitting element 300 may be reflected from the electrodes 210 and 220 disposed on the side surfaces of the inner banks 410 and 420, and may proceed upward.

In the first electrode 210, a partial region covers the first inner bank 410, and another partial region may be electrically connected to the first drain electrode 123 of the first thin film transistor 120 through the first electrode contact hole CNTD passing through the via layer 200. The first electrode 210 may receive a driving voltage from the first thin film transistor 120 through the first drain electrode 123.

In the second electrode 220, a partial region may cover the second inner bank 420, and another partial region may be electrically connected to the power source electrode 162 through the second electrode contact hole CNTS passing through the via layer 200. The second electrode 220 may receive a power voltage from the power source line 161 through the power source electrode 162.

The first electrode 210 disposed on the first inner bank 410 may protrude to a region extending from both ends of the first inner bank 410, and thus may come into contact with the via layer 200 at the protruding region. The second electrode 220 disposed on the second inner bank 420 may protrude to a region extending from both ends of the second inner bank 420, and thus may come into contact with the via layer 200 at the protruding region.

The first electrode 210 and the second electrode 220 may be disposed to respectively cover entire regions of the first inner bank 410 and the second inner bank 420. However, as described above, the first electrode 210 and the second electrode 220 may be disposed to be spaced apart from and face each other. As will be described later, a first insulating layer 510 may be disposed in a space where the electrodes may be spaced apart from and face each other, and a second insulating layer 520 and the light emitting element 300 may be disposed thereon.

Each of the electrodes 210 and 220 may include a transparent conductive material. For example, each of the electrodes 210 and 220 may include a material such as indium tin oxide (ITO), indium zinc oxide (IZO), indium tin-zinc oxide (ITZO), or the like, or a combination thereof, but is not limited thereto. In some embodiments, each of the electrodes 210 and 220 may include a conductive material having high reflectivity. For example, each of the electrodes 210 and 220 may include a metal having high reflectivity such as silver (Ag), copper (Cu), aluminum (Al), or the like, or a combination thereof. Light incident on each of the electrodes 210 and 220 may be reflected to be emitted upward from each sub-pixel PXn.

The first insulating layer 510 which may partially cover the first electrode 210 and the second electrode 220 may be disposed on the first electrode 210 and the second electrode 220. The first insulating layer 510 may be disposed to cover most of the upper surfaces of the first electrode 210 and the second electrode 220, and may partially expose the first electrode 210 and the second electrode 220. Further, the first insulating layer 510 may also be disposed in a space where the first electrode 210 and the second electrode 220 may be spaced apart from each other. In a description based on FIG. 21, the first insulating layer 510 may be disposed to have an island shape or a linear shape along a space between the first electrode branch portion 210B and the second electrode branch portion 220B in a plan view.

FIG. 21 illustrates that the first insulating layer 510 is disposed in a space where one first electrode 210 (for example, the first electrode branch portion 210B) and one second electrode 220 (for example, the second electrode branch portion 220B) are spaced apart. However, as described above, since the first electrode 210 and the second electrode 220 may be multiple first electrodes 210 and multiple second electrodes 220, the first insulating layer 510 may also be disposed between one first electrode 210 and another second electrode 220, or between one second electrode 220 and another first electrode 210.

The first insulating layer 510 may overlap a partial region on each of the electrodes 210 and 220, for example, portions of regions where the first electrode 210 and the second electrode 220 protrude in opposite directions. The first insulating layer 510 may also be disposed in a region where the inclined side surfaces and flat top surfaces of the inner banks 410 and 420 overlap each of the electrodes 210 and 220. Further, the first insulating layer 510 may also be disposed to partially cover the first electrode 210 and the second electrode 220 at sides opposite side portions at which the first electrode 210 and the second electrode 220 face each other. For example, the first insulating layer 510 may be disposed to expose only center portions of the first electrode 210 and the second electrode 220.

The first insulating layer 510 may be disposed between the light emitting element 300 and the via layer 200. A lower surface of the first insulating layer 510 may come into contact with the via layer 200, and the light emitting element 300 may be disposed on an upper surface of the first insulating layer 510. Further, the first insulating layer 510 may come into contact with the electrodes 210 and 220 at both side surfaces thereof to electrically insulate the electrodes 210 and 220 from each other.

As an example, the first insulating layer 510 may cover end portions of the first electrode 210 and the second electrode 220 protruding in the opposite directions. In the first insulating layer 510, a portion of the lower surface may come into contact with the via layer 200, and a portion of the lower surface and the side surfaces and may come into contact with the electrodes 210 and 220. Accordingly, the first insulating layer 510 may protect regions overlapping the electrodes 210 and 220 and electrically insulate the regions from each other. Further, a first semiconductor layer (310, see FIG. 23) and a second semiconductor layer (320, see FIG. 23) of the light emitting element 300 may be prevented from coming into direct contact with other base materials to prevent damage to the light emitting element 300.

However, the disclosure is not limited thereto, and in some embodiments, the first insulating layers 510 may be disposed only on regions overlapping the inclined side surfaces of the inner banks 410 and 420 among regions on the first electrode 210 and the second electrode 220. The lower surfaces of the first insulating layers 510 may be terminated at the inclined side surfaces of the inner banks 410 and 420, and the electrode 210 and 220 disposed on portions of the inclined side surfaces of the inner banks 410 and 420 may be exposed to come into contact with the contact electrode 260.

The first insulating layer 510 may be disposed to expose both end portions of the light emitting element 300. Accordingly, the contact electrode 260 may come into contact with the exposed upper surfaces of each of the electrodes 210 and 220 and both end portions of the light emitting element 300, and may transmit an electrical signal applied to the first electrode 210 and the second electrode 220 to the light emitting element 300.

In the light emitting element 300, an end portion may be electrically connected to the first electrode 210, and another end portion may be electrically connected to the second electrode 220. Both end portions of the light emitting element 300 may come into contact with the first contact electrode 261 and the second contact electrode 262, respectively.

The light emitting element 300 may be a light emitting diode. The light emitting element 300 may be a nanostructure having a size of a nano unit. The light emitting element 300 may be an inorganic light emitting diode formed of an inorganic material. In case that the light emitting element 300 is an inorganic light emitting diode, in case that a light emitting material having an inorganic crystal structure is disposed between two electrodes facing each other and an electric field may be formed in the light emitting material in a specific direction, the inorganic light emitting diode may be aligned between the two electrodes each formed with a specific polarity.

In some embodiments, the light emitting element 300 may have a structure in which a first semiconductor layer 310, an active layer 330, a second semiconductor layer 320, and an electrode layer 370 are stacked on each other. In the stacking order of the light emitting element 300, the first semiconductor layer 310, the active layer 330, the second semiconductor layer 320, and the electrode layer 370 may be sequentially disposed in a direction horizontal to the via layer 200. In other words, the light emitting element 300 in which the layers may be stacked on each other may be disposed in a lateral direction horizontal to the via layer 200. However, the disclosure is not limited thereto, and the light emitting element 300 may be aligned between the first electrode 210 and the second electrode 220 so that the above-described stacking direction may be reversed. Detailed descriptions of the structure of the light emitting element 300 will be described later with reference to FIG. 23.

The second insulating layer 530 may be disposed to overlap at least a partial region of the light emitting element 300. The second insulating layer 530 may protect the light emitting element 300 and perform a function of fixing the light emitting element 300 between the first electrode 210 and the second electrode 220.

Although FIG. 22 illustrates that the second insulating layer 530 is disposed on the upper surface of the light emitting element 300 in a cross-sectional view, the second insulating layer 530 may be disposed to surround an outer surface of the light emitting element 300. For example, like the first insulating layer 510, the second insulating layer 530 may be disposed to extend in the fifth direction DR5 and have an island shape or a linear shape along a space between the first electrode branch portion 210B and the second electrode branch portion 220B in a plan view.

Further, a portion of the material of the second insulating layer 530 may also be disposed in a region where the lower surface of the light emitting element 300 and the first insulating layer 510 may come into contact with each other. In manufacturing the display device, the portion of the material of the second insulating layer may be formed in case that the light emitting element 300 is aligned on the first insulating layer 510 and the second insulating layer 530 is disposed thereon. In case that some voids are formed in the first insulating layer 510 which may come into contact with the lower surface of the light emitting element 300, it may be formed as some of the material of the second insulating layer 530 permeate into the voids in case that the second insulating layer 530 is formed.

The second insulating layer 530 may be disposed to expose both side surfaces of the light emitting element 300. The second insulating layer 530 may be recessed inward from both side surfaces of the light emitting element 300. Accordingly, the side surfaces of the first insulating layer 510, the light emitting element 300, and the second insulating layer 530 may be stacked on each other in a stepwise manner. The contact electrodes 261 and 262 to be described later may smoothly come into contact with the side surfaces of both end portions of the light emitting element 300. However, the disclosure is not limited thereto, and a length of the second insulating layer 530 and a length of the light emitting element 300 may be the same, and thus both side surfaces may be aligned.

The second insulating layer 530 may be disposed to cover the first insulating layer 510 and may be formed by patterning in a partial region, for example, in a region where the light emitting element 300 may be exposed to come into contact with the contact electrode 260. The operation of patterning the second insulating layer 530 may be performed through dry etching or wet etching. Here, in order to prevent patterning of the first insulating layer 510, the first insulating layer 510 and the second insulating layer 530 may include materials having different etch selectivities. In other words, in case that the second insulating layer 530 is patterned, the first insulating layer 510 may perform a function of an etching stopper.

Accordingly, even in case that the second insulating layer 530 covers the outer surface of the light emitting element 300 and may be patterned so that both end portions of the light emitting element 300 are exposed, the material of the first insulating layer 510 may not be damaged. Specifically, at both end portions of the light emitting element 300 where the light emitting element 300 and the contact electrode 260 come into contact with each other, the first insulating layer 510 and the light emitting element 300 may form a smooth contact surface.

The first contact electrode 261 and the second contact electrode 262 may be respectively disposed on the upper surfaces of the first electrode 210 and the second electrode 220. Specifically, the first contact electrode 261 and the second contact electrode 262 may respectively come into contact with the first electrode 210 and the second electrode 220 at regions where the first insulating layer 510 may be patterned so that the first electrode 210 and the second electrode 220 may be partially exposed. Each of the first contact electrode 261 and the second contact electrode 262 may come into contact with an end side surface of the light emitting element 300, for example, the first semiconductor layer 310, the second semiconductor layer 320, or the electrode layer 370. Accordingly, the first contact electrode 261 and the second contact electrode 262 may transmit an electrical signal applied to the first electrode 210 and the second electrode 220 to the light emitting element 300.

The first contact electrode 261 may be disposed on the first electrode 210 to partially cover the first electrode 210, and a lower surface may partially come into contact with the light emitting element 300, the first insulating layer 510, and the second insulating layer 530. An end portion of the first contact electrode 261 in a direction in which the second contact electrode 262 may be disposed may be disposed on the second insulating layer 530. The second contact electrode 262 may be disposed on the second electrode 220 to partially cover the second electrode 220, and a lower surface may partially come into contact with the light emitting element 300, the first insulating layer 510, and a third insulating layer 540. An end portion of the second contact electrode 262 in the direction in which the first contact electrode 261 may be disposed may be disposed on the third insulating layer 540.

In the first insulating layer 510 and the second insulating layer 530, the regions disposed to cover the first electrode 210 and the second electrode 220 on the upper surfaces of the first inner bank 410 and the second inner bank 420 may be patterned. Accordingly, the first electrode 210 and the second electrode 220 may be electrically connected to the contact electrodes 261 and 262 at the exposed regions of the first electrode 210 and the second electrode 220, respectively.

The first contact electrode 261 and the second contact electrode 262 may be disposed on the second insulating layer 530 or the third insulating layer 540 to be spaced apart from each other. For example, the first contact electrode 261 and the second contact electrode 262 may come into contact with the light emitting element 300 and the second insulating layer 530 or the third insulating layer 540, but may be disposed on the second insulating layer 530 to be spaced apart from each other in the stacking direction, and thus may be electrically insulated from each other. The contact electrodes 261 and 262 may include a conductive material. For example, the contact electrodes 261 and 262 may include ITO, IZO, ITZO, aluminum (Al), or the like, or a combination thereof. However, the invention is not limited thereto.

The third insulating layer 540 may be disposed on the first contact electrode 261 to electrically insulate the first contact electrode 261 and the second contact electrode 262 from each other. The third insulating layer 540 may be disposed to cover the first contact electrode 261, and may be disposed not to overlap a partial region of the light emitting element 300 so that the light emitting element 300 may come into contact with the second contact electrode 262. The third insulating layer 540 may partially come into contact with the first contact electrode 261, the second contact electrode 262, and the second insulating layer 530 at the upper surface of the second insulating layer 530. The third insulating layer 540 may be disposed on the upper surface of the second insulating layer 530 to cover an end portion of the first contact electrode 261. Accordingly, the third insulating layer 540 may protect the first contact electrode 361 and electrically insulate the first contact electrode 261 and the second contact electrode 262. An end portion of the third insulating layer 540 in the direction in which the second electrode 220 may be disposed may be aligned with a side surface of the second insulating layer 530.

In some embodiments, the third insulating layer 540 may be omitted in the display device. Accordingly, the first contact electrode 261 and the second contact electrode 262 may be disposed on substantially the same plane, and the first contact electrode 261 and the second contact electrode 262 may be electrically insulated from each other by a passivation layer 550 to be described later.

The passivation layer 550 may be formed on the third insulating layer 540 and the second contact electrode 262 to protect members disposed on the via layer 200 from an external environment. In case that the first contact electrode 261 and the second contact electrode 262 are exposed, since a disconnection problem of the contact electrode material may occur due to electrode damage, the passivation layer 550 may cover the above. For example, the passivation layer 550 may be disposed to cover the first electrode 210, the second electrode 220, the light emitting element 300, and the like. Further, as described above, in case that the third insulating layer 540 may be omitted, the passivation layer 550 may be formed on the first contact electrode 261 and the second contact electrode 262. The passivation layer 550 may electrically insulate the first contact electrode 261 and the second contact electrode 262 from each other.

Each of the above-described first insulating layer 510, second insulating layer 530, third insulating layer 540, and passivation layer 550 may include an inorganic insulating material. For example, each of the first insulating layer 510, the second insulating layer 530, the third insulating layer 540, and the passivation layer 550 may include a material such as silicon oxide ($SiO_x$), silicon nitride ($SiN_x$), silicon oxynitride ($SiO_xN_y$), aluminum oxide ($Al_2O_3$), aluminum nitride (AlN), or the like, or a combination thereof. The first insulating layer 510, the second insulating layer 530, the third insulating layer 540, and the passivation layer 550 may be formed of the same material, but may also be formed of different materials. Further, various materials which impart insulating properties may be applied to the first insulating layer 510, the second insulating layer 530, the third insulating layer 540, and the passivation layer 550.

As described above, the first insulating layer 510 and the second insulating layer 530 may have different etch selectivities. For example, in case that the first insulating layer 510 includes silicon oxide ($SiO_x$), the second insulating layer 530 may include silicon nitride ($SiN_x$). As another example, in case that the first insulating layer 510 includes silicon nitride ($SiN_x$), the second insulating layer 530 may include silicon oxide ($SiO_x$). However, the invention is not limited thereto.

Figure 23:
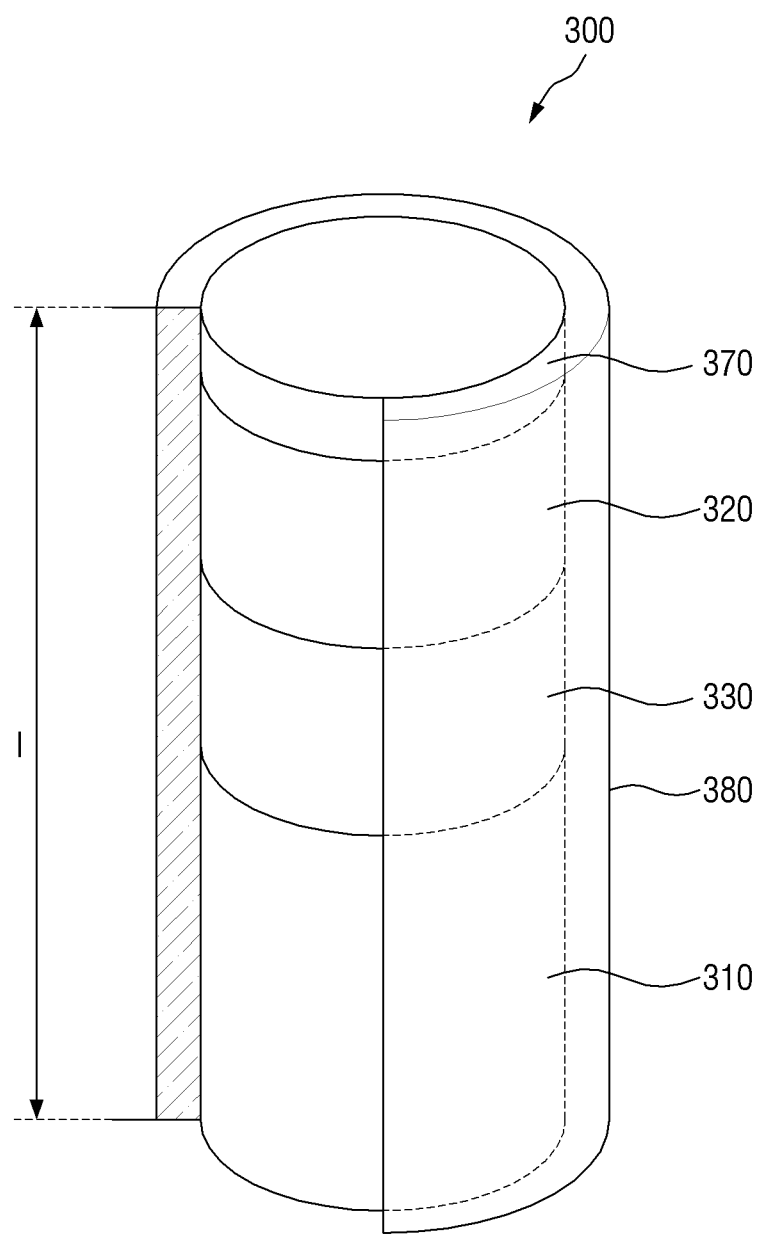
FIG. 23 is a schematic view of a light emitting element according to an embodiment.

FIG. 23 is a schematic view of the light emitting element according to an embodiment.

The light emitting element 300 may be a light emitting diode, and specifically, the light emitting element 300 may be a light emitting diode having a size of a micro-meter or nano-meter unit and formed of an inorganic material. The inorganic light emitting diode may be aligned between two electrodes in which the polarity may be formed in case that an electric field may be formed in a specific direction between the two electrodes facing each other. The light emitting element 300 may be aligned between the electrodes by the electric field formed on the two electrodes.

Referring to FIG. 23, the light emitting element 300 according to an embodiment may have a shape extending in a direction. The light emitting element 300 may have a shape such as a rod, a wire, a tube, or the like. In an embodiment, the light emitting element 300 may have a cylindrical shape or a rod shape. However, the shape of the light emitting element 300 is not limited thereto, and the light emitting element 300 may have a shape of a cube, a rectangular parallelepiped, a polygonal pillar such as a hexagonal pillar or the like, or have a shape that extends in a direction and has a partially inclined outer surface. Thus, the light emitting element 300 may have various shapes.

The light emitting element 300 may include the first semiconductor layer 310, the second semiconductor layer 320, the active layer 330, the electrode layer 370, and an insulating film 380.

The first semiconductor layer 310 may be an n-type semiconductor. As an example, in case that the light emitting element 300 emits light in a blue wavelength band, the first semiconductor layer 310 may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may include one or more among AlGaInN, GaN, AlGaN, InGaN, AlN, and InN doped with an n-type impurity. The first semiconductor layer 310 may be doped with an n-type dopant, and as an example, the n-type dopant may include Si, Ge, Sn, or the like, or a combination thereof. In an embodiment, the first semiconductor layer 310 may be n-GaN doped with n-type Si. A length of the first semiconductor layer 310 may have a range of 1.5 μm to 5 μm, but is not limited thereto.

The second semiconductor layer 320 may be disposed on the active layer 330 to be described later. The second semiconductor layer 320 may be a p-type semiconductor. As an example, in case that the light emitting element 300 emits light in a blue or green wavelength band, the second semiconductor layer 320 may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may include one or more among AlGaInN, GaN, AlGaN, InGaN, AlN, and InN doped with a p-type. The second semiconductor layer 320 may be doped with a p-type dopant, and as an example, the p-type dopant may include Mg, Zn, Ca, Se, Ba, or the like, or a combination thereof. In an embodiment, the second semiconductor layer 320 may be p-GaN doped with p-type Mg. A length of the second semiconductor layer 320 may have a range of 0.05 μm to 0.10 μm, but is not limited thereto.

Although the drawing illustrates that the first semiconductor layer 310 and the second semiconductor layer 320 are configured as one layer, the disclosure is not limited thereto. According to some embodiments, depending on the material of the active layer 330, the first semiconductor layer 310 and the second semiconductor layer 320 may further include a larger number of layers, for example, a clad layer or a tensile strain barrier reducing (TSBR) layer.

The active layer 330 may be disposed between the first semiconductor layer 310 and the second semiconductor layer 320. The active layer 330 may include a material having a single or multiple quantum well structure. In case that the active layer 330 includes a material having a multiple quantum well structure, the active layer 330 may have a structure in which quantum layers and well layers are alternately stacked on each other. The active layer 330 may emit light due to combination of electron-hole pairs according to an electrical signal applied through the first semiconductor layer 310 and the second semiconductor layer 320. For example, the active layer 330 may include a material such as AlGaN, AlGaInN, or the like in case of emitting light in a blue wavelength band. Specifically, in case that the active layer 330 has the multiple quantum well structure in which the quantum layers and the well layers are alternately stacked on each other, the quantum layer may include a material such as AlGaN, AlGaInN, or the like, or a combination thereof, and the well layer may include a material such as GaN, AlInN, or the like, or a combination thereof. In an embodiment, the active layer 330 may include AlGaInN as the quantum layer and AlInN as the well layer and thus may emit blue light having a central wavelength band in a range of 450 nm to 495 nm as described above.

However, the disclosure is not limited thereto, and the active layer 330 may have a structure in which semiconductor materials having large band gap energy and semiconductor materials having small band gap energy are alternately stacked on each other, and may also include other Group 3 to Group 5 semiconductor materials according to the wavelength bands of the emitted light. The light emitted by the active layer 330 is not limited to the light in the blue wavelength band, and in some cases, light in a red or green wavelength band may be emitted. A length of the active layer 330 may have a range of 0.05 μm to 0.10 μm, but is not limited thereto.

The light emitted from the active layer 330 may be emitted to not only an outer surface of the light emitting element 300 in a longitudinal direction but also both side surfaces of the light emitting element 300. The directivity of the light emitted from the active layer 330 is not limited to one direction.

The electrode layer 370 may be an ohmic contact electrode. However, the disclosure is not limited thereto, and the electrode layer 370 may be a Schottky contact electrode. The light emitting element 300 may include at least one electrode layer 370. FIG. 23 illustrates that the light emitting element 300 includes one electrode layer 370, but the disclosure is not limited thereto. In some cases, the light emitting element 300 may include a larger number of electrode layers 370 or the electrode layer 370 may be omitted.

The electrode layer 370 may reduce resistance between the light emitting element 300 and the electrode or contact electrode in case that the light emitting element 300 is electrically connected to the electrode or contact electrode in the display device according to an embodiment. The electrode layer 370 may include a conductive metal. For example, the electrode layer 370 may include at least one among aluminum (Al), titanium (Ti), indium (In), gold (Au), silver (Ag), indium tin oxide (ITO), indium zinc oxide (IZO), and indium tin-zinc oxide (ITZO). Further, the electrode layer 370 may include a semiconductor material doped with an n-type or p-type impurity. The electrode layer 370 may include the same material or may include different materials, but the disclosure is not limited thereto.

The insulating film 380 may be disposed to surround outer surfaces of the semiconductor layers and electrode layers described above. In an embodiment, the insulating film 380 may be disposed to surround at least the outer surface of the active layer 330, and may extend in a direction in which the light emitting element 300 extends. The insulating film 380 may perform a function of protecting the members. For example, the insulating film 380 may be formed to surround side surfaces of the members, and both end portions in the longitudinal direction of the light emitting element 300 may be formed to be exposed.

The drawing illustrates that the insulating film 380 may be formed to extend in the longitudinal direction of the light emitting element 300 and cover from the first semiconductor layer 310 to the side surface of the electrode layer 370, but the disclosure is not limited thereto. The insulating film 380 may cover only the outer surfaces of some semiconductor layers, including the active layer 330, or may cover only a portion of the outer surface of the electrode layer 370 so that the outer surface of each electrode layer 370 may be partially exposed. Further, the insulating film 380 may be formed to have a rounded upper surface in cross-section in a region adjacent to at least one end portion of the light emitting element 300.

A thickness of the insulating film 380 may have a range of 10 nm to 1.0 μm, but is not limited thereto. In an embodiment, the thickness of the insulating film 380 may be approximately 40 nm.

The insulating film 380 may include materials having insulating properties, for example, silicon oxide ($SiO_x$), silicon nitride ($SiN_x$), silicon oxynitride ($SiO_xN_y$), aluminum nitride (AlN), aluminum oxide ($Al_2O_3$), or the like, or a combination thereof. Accordingly, an electric short circuit which may occur in case that the active layer 330 comes into direct contact with the electrode which transmits an electrical signal to the light emitting element 300 may be prevented. Further, since the insulating film 380 protects the outer surface of the light emitting element 300, including the active layer 330, luminous efficiency may be prevented from being lowered.

In some embodiments, the outer surface of the insulating film 380 may be surface-treated. In manufacturing the display device, the light emitting element 300 may be aligned by being sprayed onto the electrode in a state of being dispersed in the ink. Here, in order to maintain a state in which the light emitting element 300 may be dispersed without being aggregated with other light emitting elements 300 which may be adjacent thereto in the ink, the surface of the insulating film 380 may be hydrophobically or hydrophilically treated.

The light emitting element 300 may have a length h of 1 μm to 10 μm or 2 μm to 6 μm, and in an embodiment, 3 μm to 5 μm. Further, a diameter of the light emitting element 300 may range from 30 nm to 700 nm, and an aspect ratio of the light emitting element 300 may be 1.2 to 100. However, the disclosure is not limited thereto, and the light emitting elements 300 included in the display device may have different diameters according to a difference in composition of the active layer 330. In an embodiment, the diameter of the light emitting element 300 may have a range of approximately 500 nm.

The light emitting element 300 may have a shape extending in a direction. The light emitting element 300 may have a shape such as a nanorod, a nanowire, a nanotube, or the like. In an embodiment, the light emitting element 300 may have a cylindrical shape or a rod shape. However, the shape of the light emitting element 300 is not limited thereto, and the light emitting element 300 may have various shapes such as a cube, a rectangular parallelepiped, a hexagonal pillar, and the like.

The structure of the light emitting element 300 is not limited to the case shown in FIG. 23 and may also have other structures.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. An inkjet printing apparatus comprising:
   a frame;
   an inkjet head disposed on the frame;
   a first probe disposed on the frame, disposed at a side of the inkjet head, and providing a first voltage to a substrate, the first probe movable in electrical contact with the substrate; and
   a second probe disposed on the frame, disposed at another side of the inkjet head, and providing a second voltage to the substrate, the second probe movable in electrical contact with the substrate.

2. The inkjet printing apparatus of claim 1, wherein
   the first voltage has a first polarity, and
   the second voltage has a second polarity opposite the first polarity.

3. The inkjet printing apparatus of claim 2, further comprising:
   an electric field generation device that generates the first voltage and the second voltage,
   wherein the frame includes a line providing the first voltage to the first probe and the second voltage to the second probe.

4. The inkjet printing apparatus of claim 1, wherein each of the first probe and the second probe has a rotatable roller shape.

5. The inkjet printing apparatus of claim 1, further comprising:
   a stage disposed under the inkjet head.

6. The inkjet printing apparatus of claim 5, further comprising:
   a stage moving part that moves the stage in a first direction.

7. The inkjet printing apparatus of claim 6, wherein
   each of the first probe and the second probe is rotatable,
   extending directions of a rotational shaft of the first probe and a rotational shaft of the second probe are parallel to each other, and
   the extending directions of the rotational shaft of the first probe and the rotational shaft of the second probe are in a second direction perpendicular to the first direction.

8. An inkjet printing apparatus comprising:
   a stage; and
   a print head part located above the stage, the print head part including:
      a frame;
         inkjet heads disposed on the frame;
         first probe parts disposed on the frame disposed at first sides of the inkjet heads, and providing a first voltage to a substrate, the first probe parts movable in electrical contact with the substrate; and
         second probe parts disposed on the frame disposed at second sides of the inkjet heads, and providing a second voltage to the substrate, the second probe parts movable in electrical contact with the substrate.

9. The inkjet printing apparatus of claim 8, wherein
   the first probe parts include at least one first probe having a rotatable roller shape, and
   the second probe parts include at least one second probe having a rotatable roller shape.

10. The inkjet printing apparatus of claim 9, wherein an extending direction of a rotational shaft of the first probe and an extending direction of a rotational shaft of the second probe are parallel to each other in a first direction.

11. The inkjet printing apparatus of claim 10, further comprising:
    a stage moving part that moves the stage in a second direction,
    wherein the second direction and the first direction are perpendicular to each other.

12. The inkjet printing apparatus of claim 8, wherein the first probe part includes at least one rotatable first probe driving part, and at least one first probe moving in a rotating direction of the first probe driving part.

13. The inkjet printing apparatus of claim 12, wherein the first probe has a pin shape.

14. The inkjet printing apparatus of claim 8, wherein each of the inkjet heads includes a nozzle that sprays an ink including dipoles.

15. A dipole alignment method comprising:
    generating an electric field on a target substrate on which electrode pads extending in a first direction are formed;
    spraying an ink including dipoles onto a region where the electric field is generated; and
    seating the dipoles on the target substrate, wherein
    the electric field is generated by a probe that is movable in electrical contact with the electrode pad.

16. The dipole alignment method of claim 15, wherein
    the probe is a rotatable probe, and
    an extending direction of a rotational shaft of the probe is parallel to a second direction perpendicular to the first direction.

17. The dipole alignment method of claim 15, wherein
    the target substrate includes a first electrode and a second electrode; and
    the seating of the dipoles includes seating the dipoles on the first electrode and the second electrode.

18. The dipole alignment method of claim 15, wherein the generating of the electric field and spraying the ink includes aligning orientation directions of the dipoles by the electric field.

19. The dipole alignment method of claim 15, wherein the generating of the electric field on the target substrate and spraying the ink is performed using an inkjet printing apparatus.

20. The dipole alignment method of claim 19, wherein the inkjet printing apparatus includes:

a frame;
an inkjet head disposed on the frame; and
the probe including:
- a first probe disposed at a side of the inkjet head and providing a first voltage; and
- a second probe disposed on the frame, disposed at another side of the inkjet head, and providing a second voltage.

* * * * *